US007394849B2

(12) United States Patent
Ibragimov et al.

(10) Patent No.: US 7,394,849 B2
(45) Date of Patent: Jul. 1, 2008

(54) DECISION FEEDBACK EQUALIZER WITH DYNAMIC FEEDBACK CONTROL

(75) Inventors: Edem Ibragimov, Santa Clara, CA (US); Qian Yu, Santa Clara, CA (US); Prashant Choudhary, San Jose, CA (US)

(73) Assignee: Scintera Networks Inc., Sunnyvale, CA (US)

( * ) Notice: Subject to any disclaimer, the term of this patent is extended or adjusted under 35 U.S.C. 154(b) by 80 days.

(21) Appl. No.: 11/539,810

(22) Filed: Oct. 9, 2006

(65) Prior Publication Data

US 2007/0091995 A1   Apr. 26, 2007

Related U.S. Application Data

(60) Division of application No. 11/070,485, filed on Mar. 2, 2005, now Pat. No. 7,120,193, which is a continuation-in-part of application No. 10/768,408, filed on Jan. 30, 2004, now Pat. No. 7,035,330, which is a continuation-in-part of application No. 10/322,024, filed on Dec. 17, 2002, now Pat. No. 7,039,104, which is a continuation-in-part of application No. 10/290,571, filed on Nov. 8, 2002, now Pat. No. 6,940,898.

(51) Int. Cl.
*H03H 7/30* (2006.01)
*H03H 7/40* (2006.01)
*H03K 5/159* (2006.01)

(52) U.S. Cl. .............. 375/233; 375/229; 375/230; 375/231; 375/232; 375/234; 375/346; 375/350

(58) Field of Classification Search ......... 375/229–236, 375/346, 350
See application file for complete search history.

(56) References Cited

U.S. PATENT DOCUMENTS

| 5,031,194 | A | | 7/1991 | Crespo et al. |
| 5,119,401 | A | | 6/1992 | Tsujimoto |
| 5,191,462 | A | | 3/1993 | Gitlin et al. |
| 5,561,687 | A | | 10/1996 | Turner |
| 5,646,958 | A | | 7/1997 | Tsujimoto |
| 6,141,378 | A | * | 10/2000 | d'Oreye de Lantramange .......... 375/232 |

(Continued)

OTHER PUBLICATIONS

John G. Proakis, Digital Communications Fourth Edition, 2001, pp. 598-659, McGraw-Hill Companies, Inc., New York, NY.

(Continued)

*Primary Examiner*—Curtis Odom
(74) *Attorney, Agent, or Firm*—Vedder Price P.C.

(57) ABSTRACT

A decision feedback equalizer with dynamic feedback control for use in an adaptive signal equalizer. Timing within the decision feedback loop is dynamically controlled to optimize recovery of the data signal by the output signal slicer. The dynamic timing is controlled by a signal formed as a combination of feedback and feedforward signals. The feedback signal is an error signal related to a difference between pre-slicer and post-slicer signals. The feedforward signal is formed by differentiating and delaying the incoming data signal.

17 Claims, 12 Drawing Sheets

U.S. PATENT DOCUMENTS

| | | |
|---|---|---|
| 6,144,697 A | 11/2000 | Gelfand et al. |
| 6,240,133 B1 | 5/2001 | Sommer et al. |
| 6,829,297 B2 | 12/2004 | Xia et al. |
| 2001/0007479 A1 | 7/2001 | Kim |
| 2001/0026197 A1 | 10/2001 | Tomisato et al. |
| 2004/0091040 A1 | 5/2004 | Shanbhag et al. |
| 2004/0091041 A1 | 5/2004 | Shanbhag et al. |
| 2004/0240539 A1 | 12/2004 | Shanbhag et al. |

OTHER PUBLICATIONS

John G. Proakis, Digital Communications Fourth Edition, 2001, pp. 660-708, McGraw-Hill Companies, Inc., New York, NY.

Heinrich Meyr et al., Digital Communication Receivers, Synchronization, Channel Estimation, and Signal Processing. 1998, pp. 270-323, John Wiley & Sons, Inc. New York, NY.

\* cited by examiner

DECISION FEEDBACK EQUALIZER WITH DYNAMIC FEEDBACK CONTROL

RELATED APPLICATIONS

This is a division of U.S. patent application Ser. No. 11/070,485, filed Mar. 2, 2005, which is a continuation-in-part of U.S. patent application Ser. No. 10/768,408, filed Jan. 30, 2004, which is a continuation-in-part of U.S. patent application Ser. No. 10/322,024, filed Dec. 17, 2002, which is a continuation-in-part of U.S. patent application Ser. No. 10/290,571, filed Nov. 8, 2002.

BACKGROUND OF THE INVENTION

1. Field of the Invention

The present invention relates to signal transmission and detection, and in particular, to techniques for compensating for signal distortions caused by signal dispersion and nonlinearities within the signal transmission media.

2. Description of the Related Art

Signal processing architectures for intersymbol interference (ISI) equalization as used for communications transmission and/or storage systems may be divided into two categories: discrete-time architecture and continuous-time architecture. Discrete-time architectures, commonly used in current systems, use a sampled approach to render the input continuous-time, analog waveform in discrete form. Typically, a high resolution A/D converter, which follows the analog anti-aliasing filter, is used as the sampler at the analog front end. Continuous-time architectures use an analog continuous-time approach which directly processes and equalizes the incoming analog waveform while remaining in the continuous time domain until the final data bit stream is generated.

At present, those signal processing architectures having a feedforward transversal filter and a feedback filter as their basic components are considered, and in particular, the following scenarios: discrete-time/continuous-time architectures with fractionally-spaced (i.e., tap spacing less than symbol-spaced) feedforward taps; continuous-time architecture with feedback that is nominally symbol-spaced; continuous-time/discrete-time architectures with fractionally-spaced feedback. For purposes of the presently claimed invention, the following discussion concerns "fat tap" adaptation to cover the continuous-time architecture with fractionally-spaced feedback; however, such discussion may be readily extended to cover the other scenarios as well.

Fractional-spaced feedforward filters have commonly been used either as stand-alone linear equalizers or in combination with Decision Feedback. Advantages of fractional-spaced versus symbol-spaced feedforward filters include: added robustness to constant or slowly varying sampling phase offset or sampling jitter; and improved signal-to-noise ratio (SNR) sensitivity, particularly in the absence of complete channel information, due to the role of the fractional-spaced filter as a combined adaptive matched filter and equalizer.

The adaptation technique for the tap coefficients have always implicitly assumed independence in the adaptation of the successive tap coefficients, which has been based on minimizing the mean squared error (MSE) as computed using the difference between the slicer input and output. This adaptation technique is referred to as LMSE (least mean squared error) or MMSE (minimized mean squared error) adaptation.

It can be shown that the LMSE adaptation for both fractional feedforward or symbol spaced feedback at iteration k+1 reduces to the following coefficient update equations:

$$\underline{c}^{(k+1)} = \underline{c}^{(k)} + \mu e^{(k)} \underline{s} \text{ (discrete-time adaptation case)}$$

where $c^{(k)}$ is the tap coefficient vector and $e^{(k)}$ the corresponding error at the $k^{th}$ iteration, s is the vector with components as the input waveform to the corresponding tap mixer and μ is a constant and is an adaptation parameter; and $$\underline{c} = \int_0^T \mu \cdot e(t) \underline{s}(t) dt \text{ (continuous-time adaptation case)}$$

with similar terminology as above.

When continuous-time feedback is considered, a number of difficulties are encountered. For example, it is difficult and sometimes unfeasible to design precisely symbol-spaced, flat group delay filters. If the total group delay on the feedback path for canceling successive past symbols is even slightly different from the corresponding symbol period, the performance loss can be substantial. This may necessitate the need for using fractionally-spaced feedback filters. Fractionally-spaced feedback filters may also be needed to account for the slicer-induced jitter and/or the data bits pattern-specific group delays due to frequency dependent group delays of the slicer, mixer and any other analog/digital component on the feedback data path. Further when an equalizer with fractionally-spaced feedback taps is used, independent LMS adaptation of the successive feedback taps fails because of the strongly correlated nature of the fractional tap-spaced feedback data.

SUMMARY OF THE INVENTION

A decision feedback equalizer is provided with dynamic feedback control for use in an adaptive signal equalizer. Timing within the decision feedback loop is dynamically controlled to optimize recovery of the data signal by the output signal slicer. The dynamic timing is controlled by a signal formed as a combination of feedback and feedforward signals. The feedback signal is an error signal related to a difference between pre-slicer and post-slicer signals. The feedforward signal is formed by differentiating and delaying the incoming data signal.

In accordance with one embodiment of the presently claimed invention, a decision feedback equalizer with dynamic feedback control for adaptively controlling a pre-slicer data signal that is sliced to provide a post-slicer data signal includes signal combining circuitry, controllable delay circuitry, signal slicing circuitry, decision feedback circuitry and signal differentiation circuitry. First signal combining circuitry combines a feedback signal and an input signal representing a plurality of data to provide a pre-slicer signal. The controllable delay circuitry is coupled to the first signal combining circuitry and delays the pre-slicer signal in response to a delay control signal to produce a corresponding delayed pre-slicer signal. The signal slicing circuitry is coupled to the first signal combining circuitry and slices the pre-slicer signal to produce a post-slicer signal indicative of the plurality of data. The decision feedback circuitry includes input signal timing control, is coupled to the controllable delay circuitry and the signal slicing circuitry, and feeds back the post-slicer signal in response to a timing control signal to produce the feedback signal. Second signal combining circuitry is coupled to the controllable delay circuitry and the signal slicing circuitry, and combines the delayed pre-slicer signal and the post-slicer signal to produce a difference signal indicative of a difference between the delayed pre-slicer signal and post-slicer signal. The signal differentiation circuitry, with a selected signal delay, differentiates and delays the input signal to produce a resultant signal, wherein respective portions of the resultant signal are delayed relative to corresponding portions of the input signal by the selected signal delay. Third signal combining circuitry is coupled to the second signal combining circuitry and the signal differentiation circuitry, and combines the difference signal and the resultant signal to produce the delay control signal, wherein the selected signal delay is selected and the delayed pre-slicer signal is delayed relative to the pre-slicer signal such that the timing control signal has a substantially zero alternating current (AC) signal component.

In accordance with another embodiment of the presently claimed invention, a decision feedback equalizer with dynamic feedback control for adaptively controlling a pre-slicer data signal that is sliced to provide a post-slicer data signal includes signal combiner means, controllable delay means, signal slicer means, decision feedback means and signal differentiator means. A first signal combiner means is for combining a feedback signal and an input signal representing a plurality of data and generating a pre-slicer signal. The controllable delay means is for delaying the pre-slicer signal in response to a delay control signal and generating a corresponding delayed pre-slicer signal. The signal slicer means is for slicing the pre-slicer signal and generating a post-slicer signal indicative of the plurality of data. The decision feedback means is for controlling signal timing by feeding back the post-slicer signal in response to a timing control signal and generating the feedback signal. A second signal combiner means is for combining the delayed pre-slicer signal and the post-slicer signal and generating a difference signal indicative of a difference between the delayed pre-slicer signal and the post-slicer signal. The signal differentiator means, with a selected signal delay, is for differentiating and delaying the input signal and generating a resultant signal, wherein respective portions of the resultant signal are delayed relative to corresponding portions of the input signal by the selected signal delay. A third signal combiner means is for combining the difference signal and the resultant signal and generating the delay control signal, wherein the selected signal delay is selected and the delayed pre-slicer signal is delayed relative to the pre-slicer signal such that the timing control signal has a substantially zero alternating current (AC) signal component.

In accordance with another embodiment of the presently claimed invention, a method for providing decision feedback equalization with dynamic feedback control for adaptively controlling a pre-slicer data signal that is sliced to provide a post-slicer data signal includes:

combining a feedback signal and an input signal representing a plurality of data and generating a pre-slicer signal;

delaying the pre-slicer signal in response to a delay control signal and generating a corresponding delayed pre-slicer signal;

slicing the pre-slicer signal and generating a post-slicer signal indicative of the plurality of data;

feeding back the post-slicer signal with controlled signal timing in response to a timing control signal and generating the feedback signal;

combining the delayed pre-slicer signal and the post-slicer signal and generating a difference signal indicative of a difference between the delayed pre-slicer signal and the post-slicer signal;

differentiating and delaying the input signal and generating a resultant signal, wherein respective portions of the resultant signal are delayed relative to corresponding portions of the input signal by a selected signal delay; and combining the difference signal and the resultant signal and generating the delay control signal, wherein the selected signal delay is selected and the delayed pre-slicer signal is delayed relative to the pre-slicer signal such that the timing control signal has a substantially zero alternating current (AC) signal component.

DETAILED DESCRIPTION

Figure 1:
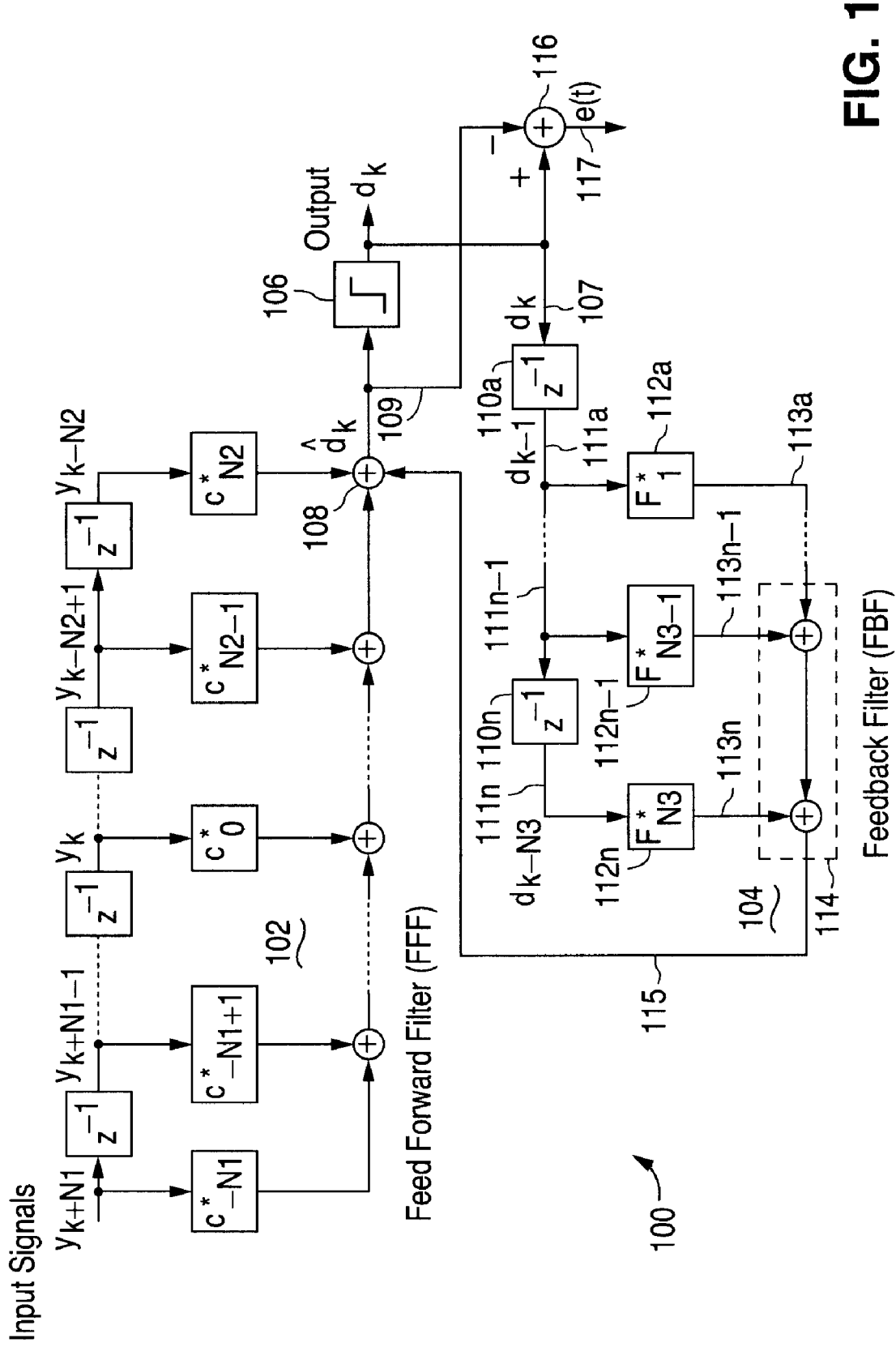
FIG. 1 is a block diagram of decision feedback equalization (DFE) circuitry in which an adaptive coefficient signal generator in accordance with the presently claimed invention can advantageously provide for improved data signal equalization.

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed.

The subject matter discussed herein, including the presently claimed invention, is compatible and suitable for use with the subject matter disclosed in the following copending, commonly assigned patent applications (the disclosures of which are incorporated herein by reference): U.S. patent application Ser. No. 10/117,293, filed Apr. 5, 2002, and entitled "Compensation Circuit For Reducing Intersymbol Interference Products Caused By Signal Transmission Via Dispersive Media"; U.S. patent application Ser. No. 10/179,689, filed Jun. 24, 2002, and entitled "Crosstalk Compensation Engine For Reducing Signal Crosstalk Effects Within A Data Signal"; U.S. patent application Ser. No. 10/244,500, filed Sep. 16, 2002, and entitled "Compensation Method For Reducing Intersymbol Interference Products Caused By Signal Transmission Via Dispersive Media"; U.S. patent application Ser. No. 10/290,674, filed Nov. 8, 2002, and entitled "Compensation Circuit And Method For Reducing Intersymbol Interference Products Caused By Signal Transmission Via Dispersive Media"; U.S. patent application Ser. No. 10/290,993, filed Nov. 8, 2002, and entitled "Adaptive Signal Equalizer With Adaptive Error Timing And Precursor/Postcursor Configuration Control"; U.S. patent application Ser. No. 10/321,893, filed Dec. 17, 2002, and entitled "Adaptive Signal Latency Control For Communications Systems Signals"; U.S. patent application Ser. No. 10/321,876, filed Dec. 17, 2002, and entitled "Adaptive Signal Equalizer With Adaptive Error Timing And Precursor/Postcursor Configuration Control"; and U.S. patent application Ser. No. 10/179,996, filed Jun. 24, 2002, and entitled "Programmable Decoding of Codes of Varying Error-Correction Capability".

In accordance with the presently claimed invention, a group of two or more adjacent fractionally-spaced feedback taps are viewed to be correlated and corresponding to essentially the same symbol so that this group of fractionally-spaced taps essentially emulates a symbol-spaced feedback tap. Such a group of fractionally-spaced taps that emulates a symbol-spaced feedback tap is referred herein as a "fat tap." Thus, successive fat taps emulate different symbol-spaced feedback taps. The adaptation of the taps within the fat tap should have some kind of adaptive timing interpolation between them so that the effective timing of the fat tap corresponds to the corresponding symbol timing. Further, both taps in the fat tap need to adapt together using LMSE adaptation, for instance, since their inputs are correlated.

The emphasized case will be that in which successive fat taps consist of disjoint taps and, thus, represent independent symbols (e.g., referred to as Independent Fat Tap Adaptation (IFTA)). Also emphasized will be the case with the constraint of only two taps within the fat tap.

Let the feedback tap spacing be denoted by $\tau$ which is sufficiently less than the symbol period. It is assumed that the feedback symbol waveform is approximately piece-wise linear within the span of time interval $\tau$. Thus, if the feedback signal is denoted as s(t), the parametric equation of the line passing through s(t) and s(t−$\tau$) may be denoted via:

$$r \cdot s(t) + (1-r) \cdot s(t-\tau)$$

for the parameter r (in general, $-\infty < r < \infty$). With the piecewise linear assumption of s(t), we have:

$$s(t-\tau_r) \approx r \cdot s(t) + (1-r) \cdot s(t-\tau)$$

for a suitable choice of the delay $\tau_r$. Note that with the piecewise linear approximation:

$$\tau_r \approx (1-r) \cdot \tau.$$

With a linear approximation of the feedback signal waveform, we represent the two tap coefficients of the fat tap as c·r and c·(1−r) where the quantity r is the timing interpolation parameter which ideally should achieve effective symbol spaced timing for the fat tap, and the quantity c is used for LMSE adaptation for estimating the past ISI that needs to be cancelled. Thus, with these two parameters, the fat tap tries to emulate the corresponding symbol-spaced feedback tap with LMS tap coefficient c. The correlation ratio between the two adapting taps of the fat tap is then $$\frac{r}{1-r}$$

. It is then required to adapt the parameters c and r for the fat tap.

For the continuous-time case, the LMSE adaptation of the parameters c and r can then be shown to be:

$$c(t) = \mu_c \cdot \int_o^t e(v) \cdot [r \cdot s(v) + (1-r) \cdot s(v-\tau)]dv;$$

$$r(t) = \mu_r \cdot \int_o^t c(v) \cdot e(v) \cdot [s(v) - s(v-\tau)]dv$$

If, as may be typical $$\text{sign}(c) = -1,$$

and since $$s(v) - s(v - \tau) \approx k\frac{d}{dt}s(v - \tau_r),$$

for a constant k, the update equation for r(t) may also be simplified to:

$$r(t) = -\mu_r^1 \cdot \int_o^t e(v) \cdot \frac{d}{dv}s(v - \tau_r)dv.$$

Note that $$\frac{d}{dt}s(t - \tau_r)$$

may easily be implemented by passing the output of the fat tap through a C-R differentiator block, which is a high-pass filter.

For the discrete-time case, the LMSE adaptation of the parameters c and r can then be shown to be:

$$c^{(k+1)} = c^{(k)} + \mu_c \cdot e^{(k)} \cdot [r^{(k)} \cdot s(t) + (1 - r^{(k)}) \cdot s(t-\tau)]$$

$$r^{(k+1)} = r^{(k)} + \mu_r \cdot c^{(k)} \cdot e^{(k)} \cdot [s(t) - s(t-\tau)]$$

The update equation for r can also be simplified to (if its known that sign(c)=-1):

$$r^{(k+1)} = r^{(k)} - \mu_r \cdot e^{(k)} \cdot [s(t) - s(t-\tau)]$$

The next step is determining which pair of two (or more) taps belong to the same fat tap. The specific two adjacent taps which form a fat tap corresponding to a specific past symbol may vary depending on the group delay variations of different analog or digital components within the feedback path such as the slicer, delay elements, summer, mixer, etc. One approach is to hypothesize that different (disjoint) pairs of taps correspond to different fat taps corresponding to different past symbols. Then, depending on the values of the feedback tap coefficients after convergence, specifically the timing interpolation parameter which should ideally be within the range (0,1) and/or the hypothesis which corresponds to the minimum mean squared error, the winning hypothesis may be selected as part of the start-up procedures of the circuit. (As noted above, ideally 0<r<1, although in general, $-\infty < r < \infty$. However, it should be understood that maximum advantages of timing interpolation as provided by the presently claimed invention are realized when 0<r<1 (e.g., where the complement 1−r of r when r=0.2 is 1−r=1−0.2=0.8). When r lies outside of the range (0,1), i.e., $-\infty < r < 0$ or $1 < r < \infty$ (e.g., where the complement 1−r of r when r=1.2 is 1−r=1−1.2=−0.2), extrapolation takes place instead of interpolation and performance degradation may result.

Referring to FIG. 1, a decision feedback equalizer (DFE) 100 typically includes a feed forward filter 102 and a feedback filter 104. The feedback filter 104 processes the decisions $d_k$ from the output of the final signal slicer 106. The coefficients, or gains, $F^*_i$ can be adjusted to cancel ISI on the current symbol based upon past detected symbols. The feed forward filter 102 has $N_1+N_2+1$ taps while the feedback filter 104 has $N_3$ taps, and the output $\hat{d}_k$ 109 of the final signal summer 108 can be expressed as follows:

$$\hat{d}_k = \sum_{n=-N_1}^{N_2} c_n^* y_{k-n} + \sum_{i=1}^{N_3} F_i d_{k-i}$$

where
$c^*_n$=tap gains for feed forward filter 102
$y_n$=input signals to feed forward filter 102
$F^*_i$=tap gains for feedback filter 104
$d_i(i<k)$=previous decision made upon detected signal $d_k$ Accordingly, once the output $d_k$ is provided by the output summer 108 of the feed forward filter 102, the final output $d_k$ is decided. Then, the final output $d_k$ and the previous decisions $d_{k-1}, d_{k-2}, \ldots$ are fed back through the feedback filter 104, thereby providing the solution for the next decision $\hat{d}_{k+1}$ at the output 109 of the final signal summer 108 in the feed forward filter 102 in accordance with the foregoing equation.

More specifically, with respect to the feedback filter section 104, the output signal 107 is successively delayed through a sequence of time delay elements 110a, 110b, ... 110n (e.g., with each successive time delay element 110 imparting a time delay equal to one symbol). Each of the successively time-delayed signals 111a, 111b, ... 111n are processed in their respective adaptive gain stages 112a, 112b, ... 112n to provide corresponding adaptive feedback signals 113a, 113b, ... 113n which are summed together in a signal summing circuit 114 to produce the equalization feedback signal 115.

The adaptive gain stages 112a, 112b, ... 112n process their respective time-delayed signals 111a, 111b ... 111n based upon an error signal 117 representing the error, if any, between the post-slicer data signal 107 and the pre-slicer data signal 109. This error signal 117 is typically generated by subtracting the pre-slicer data signal 109 from the post-slicer data signal 107 in a signal summing circuit 116.

Figure 2:
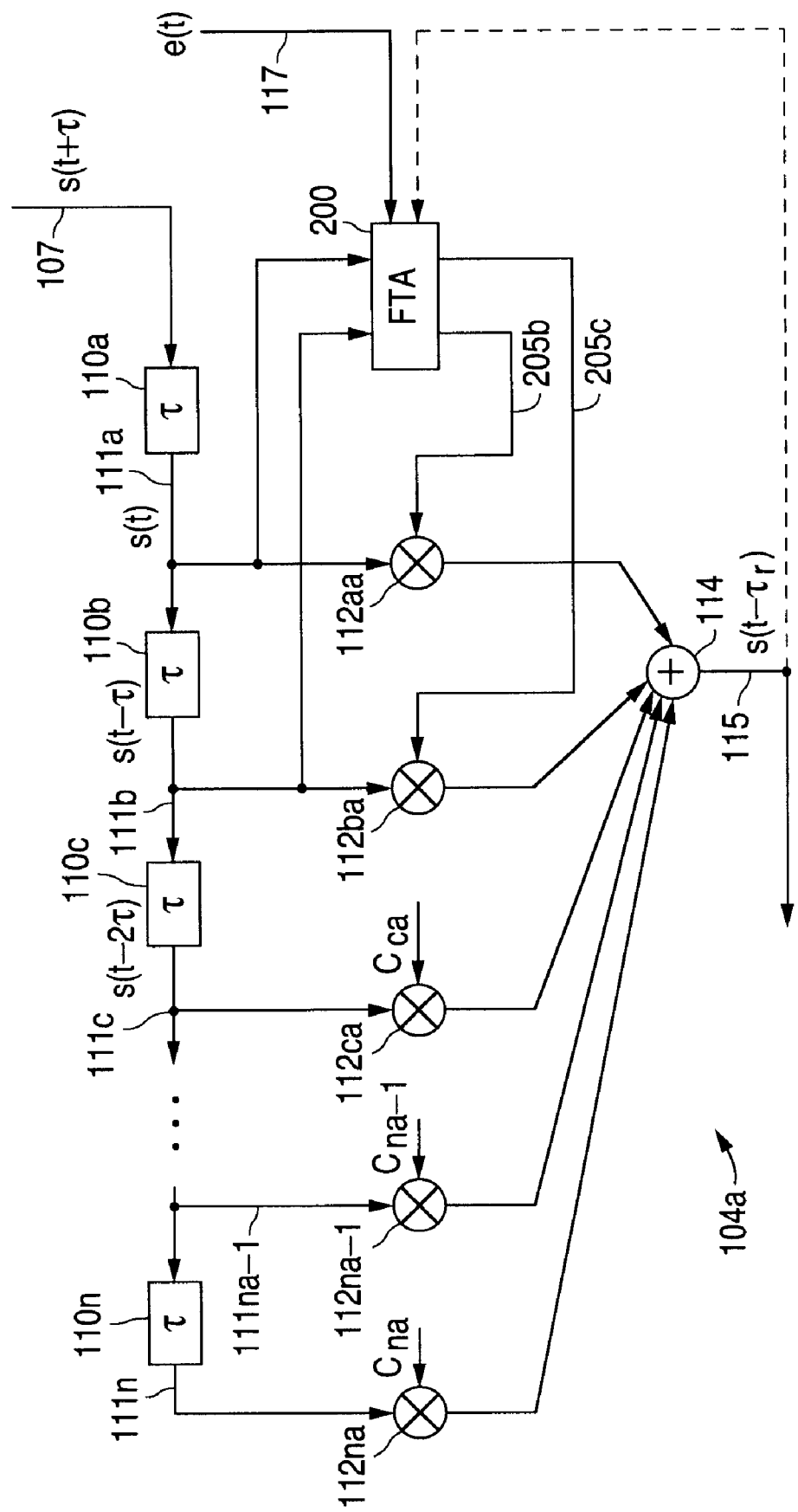
FIG. 2 is a block diagram of the feedback portion of a DFE circuit in which an adaptive coefficient signal generator in accordance with the presently claimed invention is used to provide the adaptive coefficient signals.

Referring to FIG. 2, a feedback filter 104a for use in a DFE in a continuous time signal application includes the time delay elements 110 as well as the adaptive gain stages 112. In accordance with the presently claimed invention, each of the time delay elements 110 is a fractional delay element and, therefore, imparts to its data signal a time delay of a fraction of the data symbol, and each of the adaptive gain stages 112 is a multiplier that multiplies its respective time-delayed input signal 111 by one of two adaptive coefficient signals 205b, 205c (discussed in more detail below). Additionally, a fat tap adaptation (FTA) stage 200 is included. As discussed in more detail below, this FTA stage 200 provides the adaptive coefficient signals 205b, 205c. In accordance with one embodiment, this FTA stage 200 provides these adaptive coefficient signals 205b, 205c in accordance with the error signal 117 and the corresponding time-delayed signal 111a, 111b processed by the related adaptive gain stages 112aa, 112ba. In accordance with another embodiment, the FTA stage 200 also uses the equalization feedback signal 115.

It should be understood that, in conformance with the discussion herein, additional pairs of adaptive gain stages 112 can also have corresponding FTA stages 200; however, only one such FTA stage 200 is shown in FIG. 2 for purposes of simplified illustration.

By using the adaptive coefficient signals 205b, 205c provided by the FTA stage 200, adaptive gain stages 112aa and 112ba operate as correlated taps since adaptive coefficient signals 205b and 205c are correlated (discussed in more detail below). On the other hand, those among the remaining adaptive gain stages 112*ca*, . . . , 112*na*-1-112*na* that do not use a corresponding FTA stage 200 are independent taps to the extent that their respective adaptive coefficient signals Cca, . . . , Cna-1, Can are independent, i.e., uncorrelated.

Figure 3:
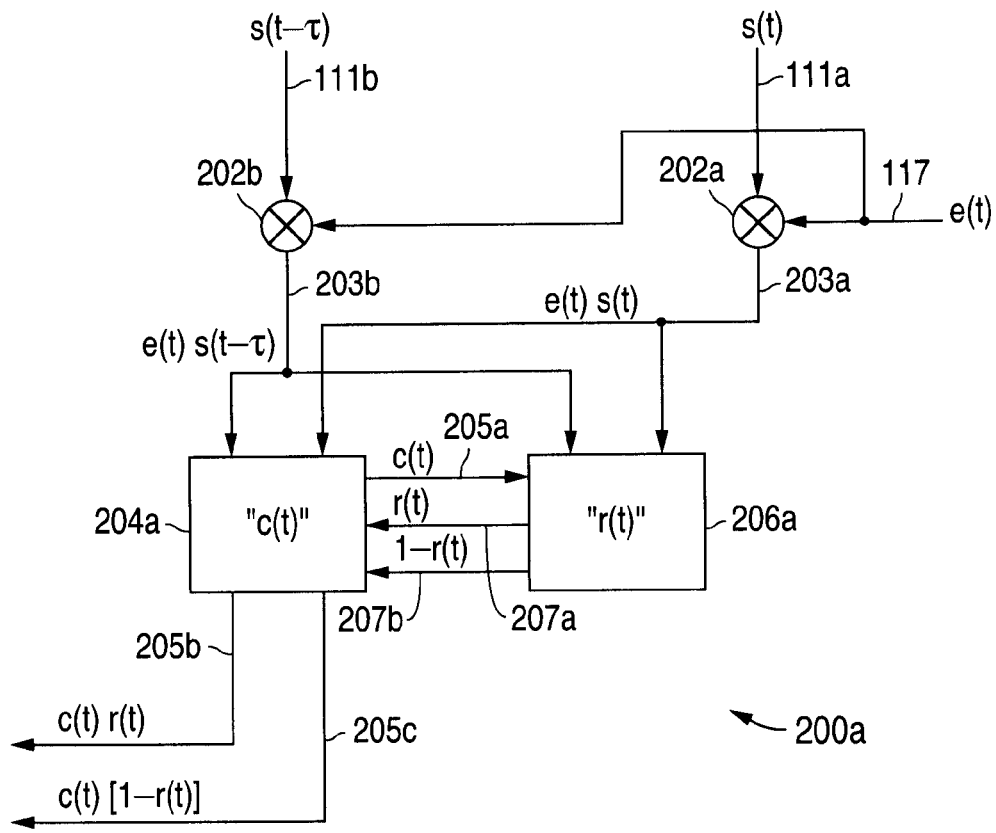
FIG. 3 is a block diagram of one embodiment of an adaptive coefficient signal generator in accordance with the presently claimed invention.

Referring to FIG. 3, one example 200*a* of the FTA stage 200 (FIG. 2) includes multiplier circuits 202*a*, 202*b* and control signal generator circuitry implemented as a coefficient signal generator 204*a* and a timing interpolation parameter signal generator 206*a*, all interconnected substantially as shown. The adjacent time-delayed feedback signals 111*a*, 111*b* are multiplied in their respective multiplier circuits 202*a*, 202*b* with the error signal 117. The resulting product signals 203*a*, 203*b* are processed by the control signal generator circuits 204*a*, 206*a*. As discussed in more detail below, the first control signal generator circuit 204*a* provides an adaptation control signal 205*a* to the second control signal generator circuit 206*a* which, in return, provides two other adaptation control signals 207*a*, 207*b* to the first control signal generator 204*a*. As a result of processing these input signals 203*a*, 203*b*, 207*a*, 207*b*, the first control signal generator circuit 204*a* provides the adaptive coefficient signals c(t)r(t) 205*b*, c(t)(1−r(t)) 205*c*, where signal element c(t) is the weighting factor and signal element r(t) is the factor indicative of the degree of correlation between the adjacent time-delayed feedback signals 111*a*, 111*b*.

Figure 4:
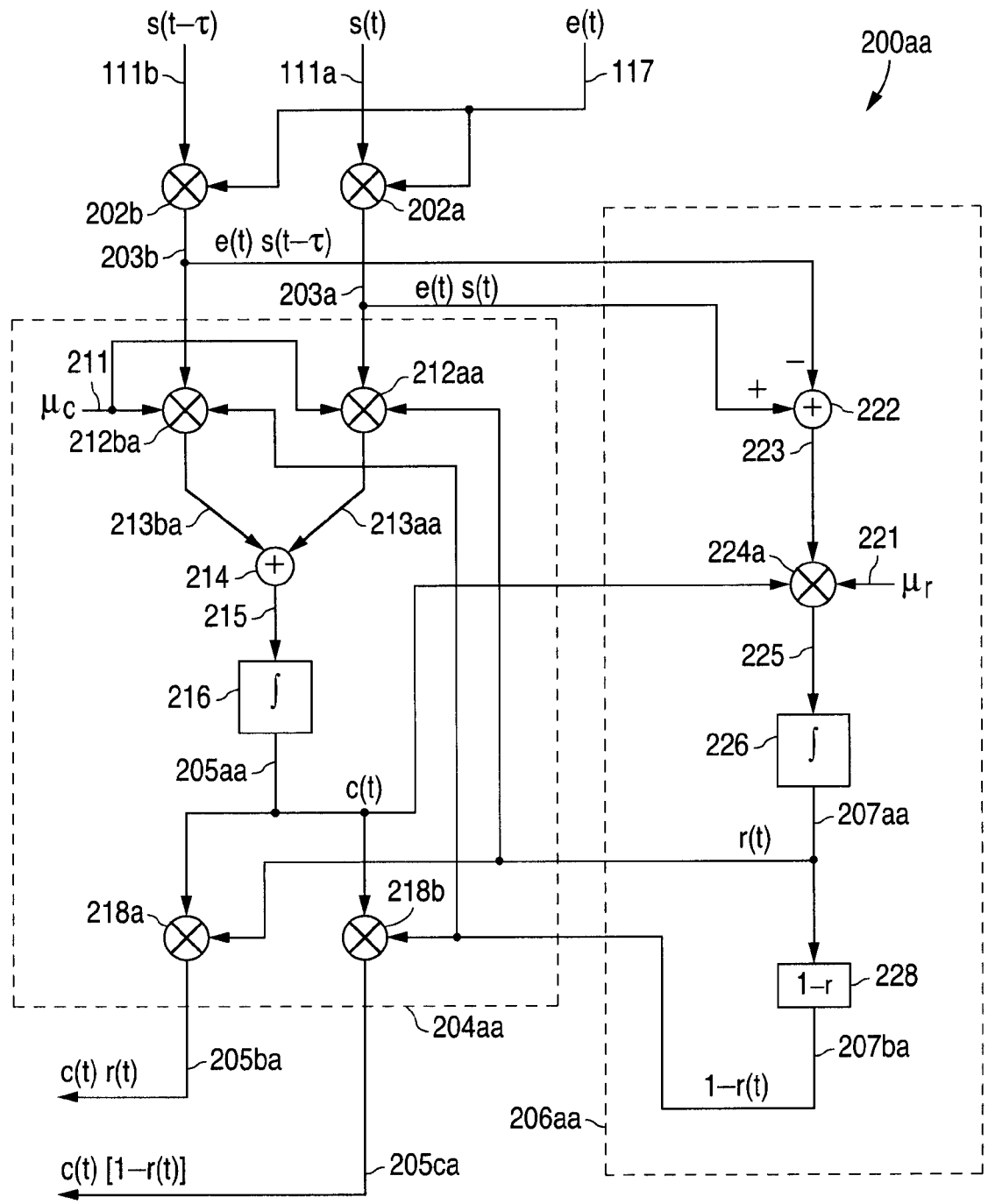
FIG. 4 is a block diagram of an exemplary implementation of the adaptive coefficient signal generator of FIG. 3.

Referring to FIG. 4, one example 200*aa* of the FTA circuit 200*a* of FIG. 3 implements the control signal generators 204*a*, 206*a* substantially as shown. In the first control signal generator 204*aa*, the initial product signals 203*a*, 203*b* are further multiplied in further multiplier circuits 212*aa*, 212*ba* with the adaptation control signals 207*aa*, 207*ba* from the other control signal generator 206*aa*. An additional constant signal 211 can also be multiplied as part of the product operations, or can be implemented as a constant scaling factor within the multiplier circuits 212*aa*, 212*ba*.

The resulting product signal 213*aa*, 213*ba* are summed in a signal summing circuit 214. The resulting sum signal 215 is integrated in an integration circuit 216 (e.g., a low pass filter) to produce the first adaptation control signal 205*aa*. This adaptation control signal 205*aa*, in addition to being provided to the other control signal generator 206*a*, is multiplied within further multiplication circuits 218*a*, 218*b* with the other adaptation control signals 207*aa*, 207*ba* provided by the other control signal generator 206*aa*. The product signals resulting from these multiplication operations are the adaptive coefficient signals 205*ba*, 205*ca*.

In the second control signal generator 206*aa*, the initial product signals 203*a*, 203*b* are differentially summed in a signal summing circuit, where the second product signal 203*b* is subtracted from the first product signal 203*a*. The resulting difference signal 223 is multiplied in a multiplier circuit 224*a* with the adaptation control signal 205*aa* provided by the first control signal generator 204*aa*. As with the input multiplier circuits 212*aa*, 212*ba* of the first control signal generator 204*aa*, an additional constant signal 221 can also be used in this multiplication operation, or, alternatively, be implemented as a constant scaling factor within the multiplication circuit 224*a* operation.

The resulting product signal 225 is integrated by another signal integration circuit 226 (e.g., a low pass filter) to produce one of the adaptation control signals 207*aa* used by the first control signal generator 204*aa*.

This adaptation control signal 207*aa* is further processed by a signal complement circuit 228 in which the input signal 207*aa* is subtracted from a reference signal having a normalized value, with the resulting difference signal 207*ba* serving as the other adaptation control signal used by the first control signal generator 204*aa*. For example, if the value of the incoming signal 207*aa* were considered to have a normalized signal value range bounded by the values of zero and unity, the signal complement circuit 228 subtracts the incoming signal 207*aa* from the value of unity to produce the output signal 207*ba*.

Figure 5:
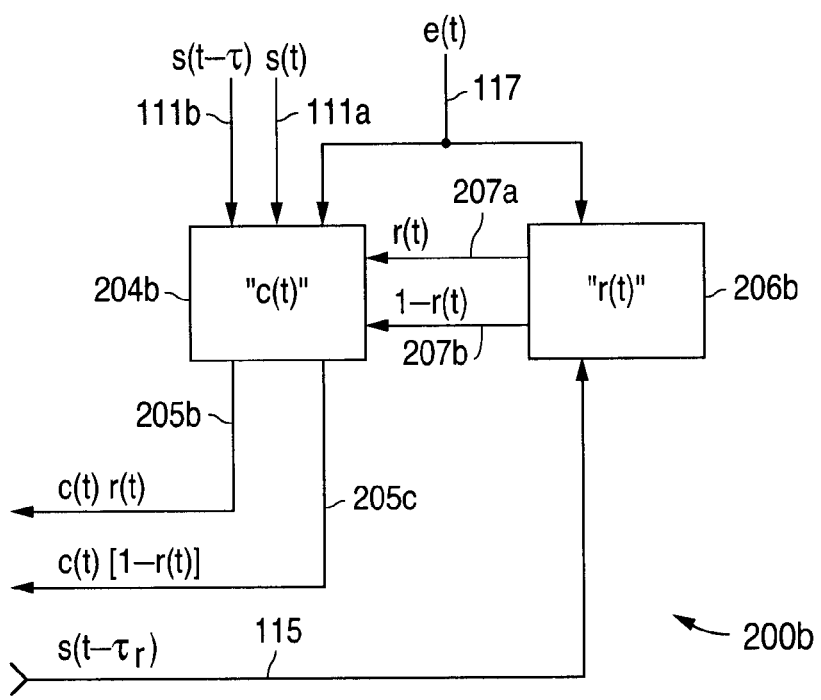
FIG. 5 is a block diagram of another embodiment of an adaptive coefficient signal generator in accordance with the presently claimed invention.

Referring to FIG. 5, another embodiment 200*b* of the FTA circuitry 200 (FIG. 2) uses alternative implementations 204*b*, 206*b* of the control signal generators to process the incoming data signals 111*a*, 111*b*, the error signal 117 and the equalization feedback signal 115.

Figure 6:
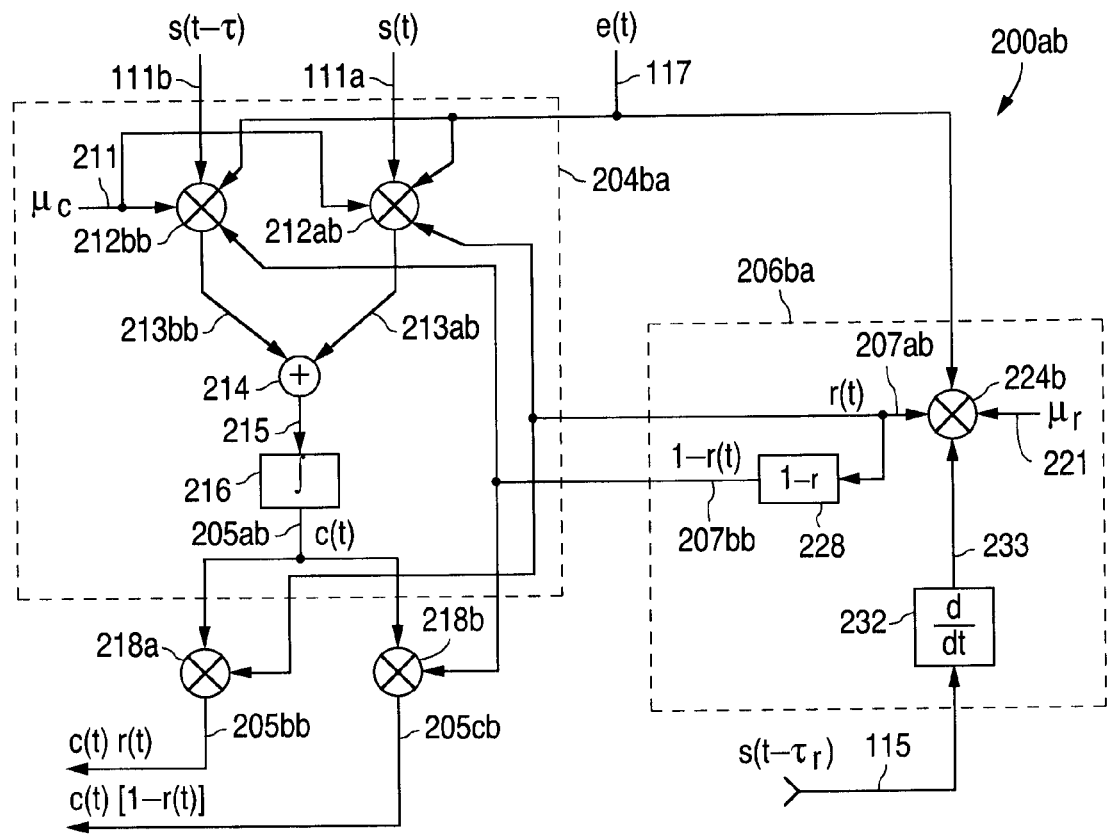
FIG. 6 is a block diagram of an exemplary implementation of the adaptive coefficient signal generator of FIG. 5.

Referring to FIG. 6, one implementation 200*ab* of the FTA circuit 200*b* of FIG. 5 can be implemented substantially as shown. In the first control signal generator 204*ba*, the time-delayed data signals 111*a*, 111*b* and error signal 117 are multiplied in the multiplier circuits 212*ab*, 212*bb* (with the multiplication, or scaling, constant 211 included as part of the operation as discussed above) along with the adaptation control signals 207*ab*, 207*bb* from the other control signal generator 206*ba*. The resulting product signals 213*ab*, 213*bb* are summed in the summing circuit 214. The resulting sum signal 215 is integrated in the signal integration circuit 216 (e.g., a low pass filter) to produce an adaptation control signal 205*ab* (which, in this implementation, is used internally and is not provided to the other control signal generator 206*ba*). This signal 205*ab* is multiplied in output multiplier circuits 218*a*, 218*b* with the adaptation control signals 207*ab*, 207*bb* provided by the other control signal generator 206*ba* to produce the adaptive coefficient signals 205*bb*, 205*cb*.

In the second control signal generator 206*ba*, the equalization feedback signal 115 is differentiated in a signal differentiation circuit 232 (e.g., a high pass filter). The resulting differentiated signal 233 is multiplied in a multiplier circuit 224*b* with the error signal 117 (with the multiplication, or scaling, constant 221 included as part of the operation as discussed above). The resulting product signal 207*ab* forms one of the adaptation control signals provided to the first control signal generator 204*ba*. This signal 207*ab* is also complemented by the signal complement circuit 228 (as discussed above) to produce the other adaptation control signal 207*bb* provided to the first control signal generator 204*ba*.

Figure 7:
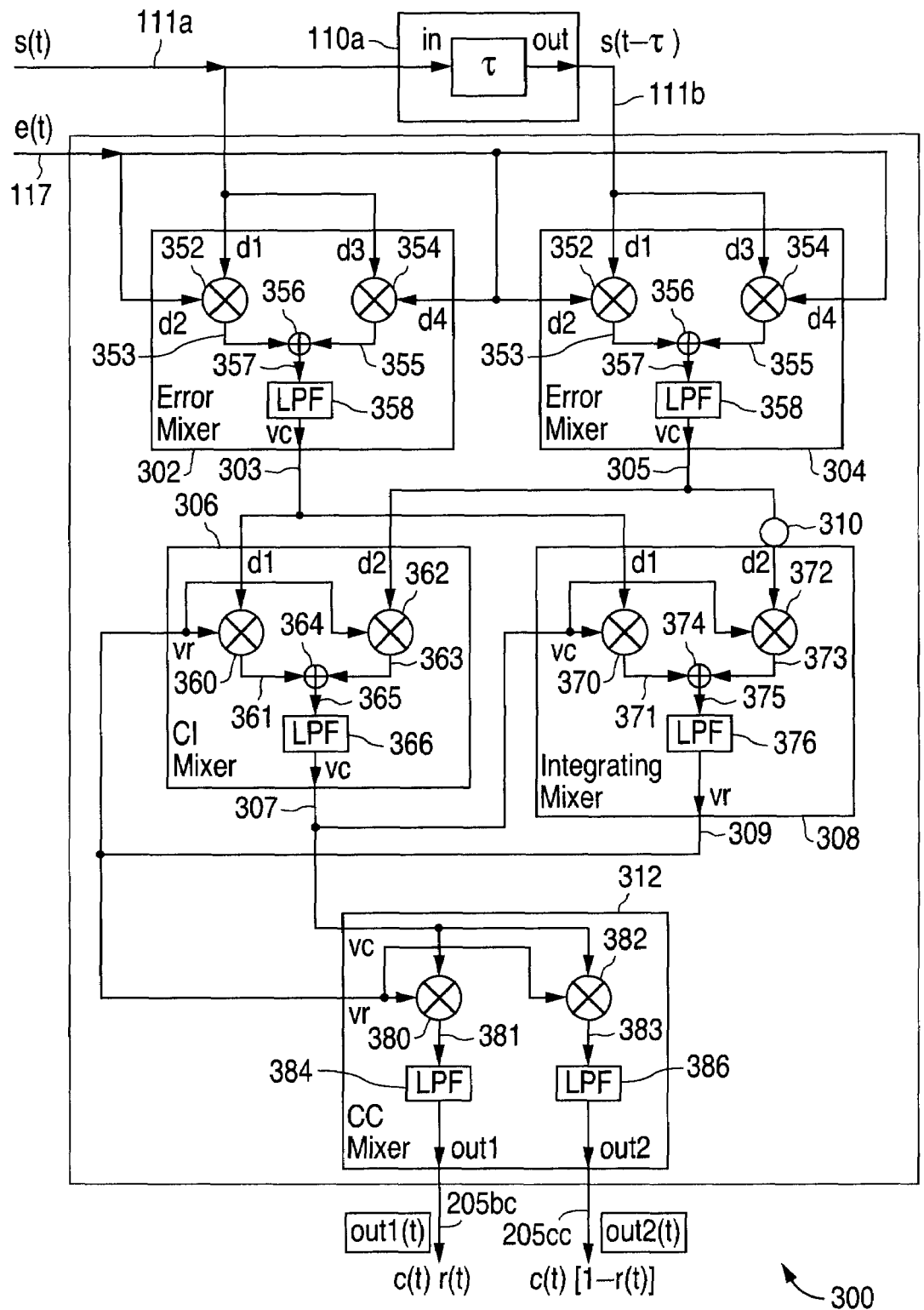
FIG. 7 is a block diagram of an alternative implementation of the adaptive coefficient signal generator of FIG. 4.

Referring to FIG. 7, an adaptive coefficient signal generator in accordance with another embodiment 300 of the presently claimed invention includes error mixer stages 302, 304, a complement integrating mixer stage 306, an integrating mixer stage 308 and a complement coefficient mixer stage 312, all interconnected substantially as shown. The time-delayed data signals 111*a*, 111*b* are received and processed by the error mixer stages 302, 304. Each error mixer stage 302, 304 multiplies these signals 111*a*, 111*b* with the error signal 117 in signal multipliers 352, 354. The resulting product signals 353, 355 are summed in a signal combiner 356 and the sum signal 357 is integrated by a signal integration circuit 358 (e.g., a low pass filter).

The signals 303, 305 produced by these mixer stages 302, 304 are further processed by the complement integrating mixer stage 306 and integrating mixer stage 308. The complement integrating mixer 306 multiplies signals 303 and 305 in signal multipliers 360, 362 with the signal 309 produced by the integrating mixer stage 308. The resulting product signals 361, 363 are summed in a signal combiner 364. The sum signal 365 is integrated by a signal integration circuit 366 (e.g., a low pass filter).

The integrating mixer stage 308 multiplies signal 303 and signal 305 (which is inverted by a signal inversion circuit 310) in signal multipliers 370, 372 with the signal 307 produced by the complement integrating mixer stage 306. The resulting product signals 371, 373 are summed in a signal combiner 374. The sum signal 375 is integrated by a signal integration circuit 376 (e.g., a low pass filter).

The signals 307, 309 produced by the complement integrating mixer stage 306 and integrating mixer stage 308 are multiplied in the signal multipliers 380, 382 of the complement coefficient mixer stage 312 with the signal 309 produced by the integrating mixer stage 308. The resulting product signals 381, 383 are integrated in respective signal integration circuits 384, 386 (e.g., low pass filters), thereby producing the adaptive coefficient signals 205bc, 205cc.

Figure 8:
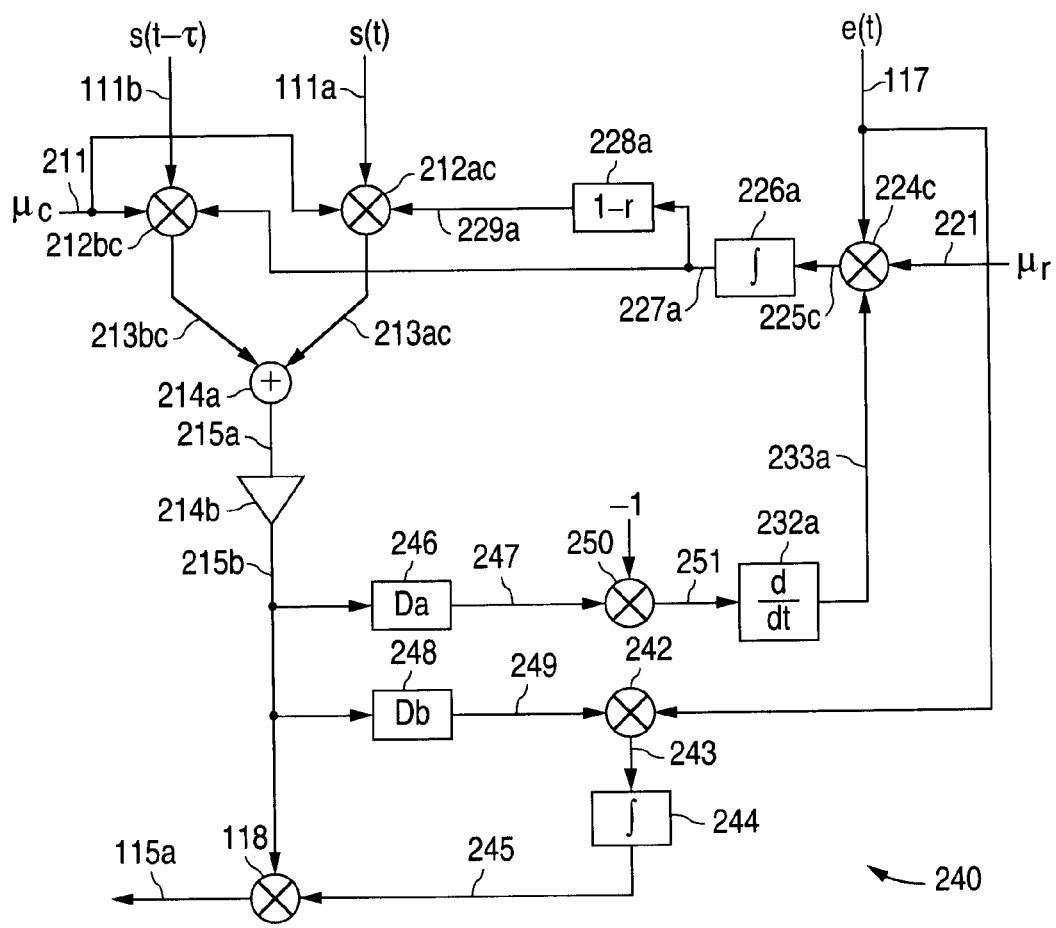
FIG. 8 is a block diagram of an alternative implementation of the adaptive coefficient signal generator of FIG. 6.

Referring to FIG. 8, an adaptive coefficient signal generator in accordance with another embodiment 240 of the presently claimed invention shares some similarities with the implementation shown in FIG. 6. The data signals 111a, 111b are multiplied in multiplier circuits 212ac, 212bc (with a multiplication, or scaling, constant 211 as desired). The resulting product signals 213ac, 213bc are summed in a signal combiner 214a and the sum signal 215a is buffered by a gain stage 214b. The resulting buffered signal 215b is multiplied in a signal multiplier 118 with an integrated signal 245 (discussed in more detail below) to produce the equalization feedback signal 115a, and is also processed by two signal delay stages 246, 248 (discussed in more detail below).

The buffered signal 215b is processed by the first signal delay stage 246, which compensates for signal delays introduced by the signal slicer 106 (FIG. 1), the feedback signal multiplication circuit 118 and the feedback signal summing circuitry 108 (FIG. 1) while subtracting out a delay corresponding to that introduced by the signal inversion circuitry 250 and signal differentiation circuit 232a. The delayed signal 247 is inverted in a signal inversion circuit 250. The inverted signal 251 is differentiated in a signal differentiation circuit 232a (e.g., a high pass filter).

The differentiated signal 233a is multiplied in a signal multiplier 224c with the error signal 117 (along with a multiplication, or scaling, constant 221 as desired). The resulting product signal 225c is integrated in a signal integration circuit 226a (e.g., a low pass filter) to produce the adaptation control signal 227a for signal multiplier 212bc. This signal 227a is also complemented by a signal complement circuit 228a (as discussed above) to produce the other adaptation control signal 229a for signal multiplier 212ac.

The second signal delay stage 248 compensates for signal delays introduced by the signal slicer 106 (FIG. 1), the feedback multiplier 118 and feedback signal summer 108 (FIG. 1). The resulting delayed signal 249 is multiplied in a signal multiplier 242 with the error signal 117. The resulting product signal 243 is integrated in a signal integration circuit 244 (e.g., a low pass filter). The integrated signal 245 is multiplied with the buffered signal 215b in the feedback signal multiplier 118 to produce the equalization feedback signal 115a.

Figure 9:
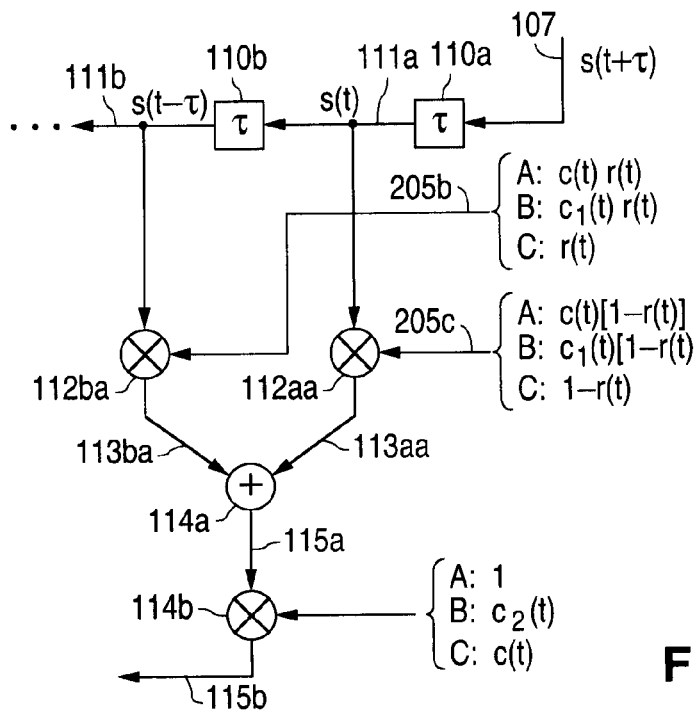
FIG. 9 is a block diagram depicting signal adaptation using correlated taps in accordance with another embodiment of the presently claimed invention.

Referring to FIG. 9, the adaptive coefficient signals as discussed above can be used in an adaptive signal equalizer with fractionally-spaced feedback in a number of ways. As discussed above, the time-delayed data signals 111a, 111b are multiplied in signal multipliers 112aa, 112ba with the adaptive coefficient signals 205b, 205c, with the resulting product signals 113aa, 113ba combined in a signal combiner 114a to produce a signal 115a which may or may not be the final equalization feedback signal (discussed in more detail below). For example, in scenario A, the first adaptation control signal 205b corresponds to a product of a weighting factor c(t) and the correlation factor r(t), while the second adaptation control signal 205c corresponds to a product of the weighting factor c(t) and the complement [1−r(t)] of the correlation factor r(t). The sum signal 115a can be used directly as the final equalization feedback signal or can be further scaled (e.g., multiplied by a value of unity) in the output multiplier 114b to produce the final equalization feedback signal 115b.

In scenario B, the first adaptation control signal 205b corresponds to a product of a partial weighting factor $c_1(t)$ and the correlation factor r(t), while the second adaptation control signal 205c corresponds to a product of the partial weighting factor $c_1(t)$ and the complement [1−r(t)] of the correlation factor r(t). The sum signal 115a is multiplied in the multiplier 114b by a final weighting factor $c_2(t)$ to produce the final equalization feedback signal 115b.

In scenario C, the first adaptation control signal 205b corresponds to the correlation factor r(t), while the second adaptation control signal 205c corresponds to the complement [1−r(t)] of the correlation factor r(t). The sum signal 115a is multiplied in the output multiplier 114b by the weighting factor c(t) to produce the final equalization feedback signal 115b.

A number of enhancements or modifications may be used to improve the performance over the IFTA with two taps within the fat tap.

Fixed Ratio Fat Tap with Hypothesis Testing

In this modification, adaptation of r may not occur in a continuous-time basis. One tap in the fat tap may be set to be at c with LMS adaptation (discrete-time or continuous-time), while the coefficient of the other tap within the fat tap is related to the first tap coefficient as a multiple by a correlation parameter (of the form $$\frac{1-r}{r}$$

as described above). A discrete set of such hypotheses corresponding to different values of the correlation parameter $$\frac{1-r}{r}$$

may be assumed. Each hypothesis is tested and the different taps, which may be LMS-adaptable, are adapted and, after convergence, the steady-state mean square error and/or the adapted filter coefficients may be used to decide on the right hypothesis (the right hypothesis may be selected to be the one with minimum MSE and/or acceptable patterns within the tap coefficients).

Multi-tap FAT Tap with Linear Interpolation

Multiple taps (more than two) and/or a variable number of taps may be used within a fat tap. A simple but effective approach here is to do multiple stages of linear interpolation, each stage consisting of a linear interpolation between some two points obtained from the earlier stage to give one new point which may be used in the next stage. The multi-tap fat tap will then have more than two parameters to adapt.

As an example, consider three feedback taps within a fat tap with input signals s(t), s(t−τ), s(t−2·τ). Then, $s(t-\tau_{r_1}) = r_1 \cdot s(t) + (1-r_1) \cdot s(t-\tau)$ may first be formed as a linear interpolation of s(t), s(t−τ), and then $s(t-\tau_{r_2}) = r_2 \cdot s(t-\tau_{r_1}) + (1-r_2) \cdot s(t-2\tau)$ is expected to be the symbol-spaced feedback signal. The feedback tap coefficients for the fat tap with input signals s(t), s(t−τ), s(t−2·τ) are then $c \cdot r_1 \cdot r_2$, $c \cdot (1-r_1) \cdot r_2$, $c \cdot (1-r_2)$. The adaptation updates of the 3 parameters $r_1$, $r_2$, c in the continuous-time domain are as follows:

$$c(t) = \mu_c \cdot \int_0^t e(v) \cdot \begin{bmatrix} r_1 \cdot r_2 \cdot s(v) + (1-r_1) \cdot r_2 \cdot \\ s(v-\tau) + (1-r_2) \cdot s(v-2\cdot\tau) \end{bmatrix} dv$$

$$r_1(t) = \mu_r \cdot \int_0^t c(v) \cdot r_2(v) \cdot e(v) \cdot [s(v) - s(v-\tau)] dv$$

$$r_2(t) = \mu_r \cdot \int_0^t c(v) \cdot e(v) \cdot \begin{bmatrix} r_1 \cdot s(v) + (1-r_1) \cdot \\ s(v-\tau) - s(v-2\cdot\tau) \end{bmatrix} dv$$

Knowing a priori the signs of c, $r_2$ the above equations may be simplified. With an intermediate output of the fat tap defined as $$f_i(t) = c \cdot r_1 \cdot r_2 s(t) + c \cdot (1-r_1) \cdot r_2 s(t-\tau),$$

and the final output as $$f(t) = f_i(t) + c \cdot (1-r_2) \cdot s(t \cdot 2 \cdot \tau),$$

then the following simplified update equations result:

$$r_1(t) = \mu_r \cdot \int_o^t e(v) \cdot \frac{df_i(v)}{dv} dv$$

$$r_2(t) = \mu_r \cdot \int_o^t e(v) \cdot \frac{df(v)}{dv} dv$$

Note that $$\frac{df_i(v)}{dv}$$

$$\frac{df(v)}{dv}$$

may easily be implemented by passing the outputs of the fat tap $f_i(t)$, $f(t)$ through the C-R differentiator block, which is a high-pass filter.

Multi-tap Fat Tap with Superlinear Interpolation

More general interpolation can also be employed, especially when more than two taps are included within the fat tap, such as quadratic interpolation. For example, with three feedback taps within a fat tap and with input signals s(t),s(t–τ),s(t–2·τ), the corresponding tap coefficients may be given as $c \cdot f_0(r)$, $c \cdot f_1(r)$, $c \cdot f_2(r)$ for some appropriately selected functions $f_0(\cdot)$, $f_1(\cdot)$, which in general may also be functions of more than one parameter. The adaptation updates are then given as:

$$c(t) = \mu_c \cdot \int_o^t e(v) \cdot \begin{bmatrix} f_0(r) \cdot s(v) + f_1(r) \cdot s(v-\tau) + \\ f_2(r) \cdot s(v-2\cdot\tau) \end{bmatrix} dv$$

$$\frac{d}{dt} r(t) = c(t) \cdot e(t) \cdot \begin{bmatrix} f_0'(r) \cdot s(t) + f_1'(r) \cdot s(t-\tau) + \\ f_2'(r) \cdot s(t-2\cdot\tau) \end{bmatrix}$$

which may be approximated by the following explicit update equation for r(t):

$$r(t) = \mu_r \cdot \int_0^t c(v) \cdot e(v) \cdot \begin{bmatrix} f_0'(r) \cdot s(v) + f_1'(r) \cdot s(v-\tau) + \\ f_2'(r) \cdot s(v-2\cdot\tau) \end{bmatrix} dv$$

Fat Tap with Gain Offset

To compensate for a residual but unknown gain offset between the taps in a fat tap or to control the linearity range, a fat tap with gain offset may be used. For example, consider two feedback taps within a fat tap with input signals s(t),s(t–τ). The tap coefficients for these two taps are then respectively $c \cdot r$, $c \cdot a \cdot (1-r)$. The adaptation updates for the three parameters (c,a,r) are then given as:

$$c(t) = \mu_c \cdot \int_0^t e(v) \cdot [r \cdot s(v) + a \cdot (1-r) \cdot s(v-\tau)] dv$$

$$r(t) = \mu_r \cdot \int_0^t c(v) \cdot e(v) \cdot [s(v) - a \cdot s(v-\tau)] dv$$

$$a(t) = \mu_c \cdot \int_0^t c(v) \cdot e(v) \cdot (1-r) \cdot s(v-\tau) dv$$

Correlated Fat Tap Adaptation (CFTA)

Multiple fat taps may share one or more taps such that each tap could correspond to more than one symbol (e.g., two symbols). It would then be expected that a set of fat taps together emulate multiple symbol-spaced feedback taps. For example, consider three feedback taps with input signals s(t), s(t–τ), s(t–2·τ) such that these together could correspond to two symbol-spaced feedback taps. The first fat tap which corresponds to the first past symbol consists of the feedback taps with inputs s(t),s(t–τ), and the second fat tap corresponds to the second past symbol and consists of the feedback taps with inputs s(t–τ), s(t–2·τ); thus, the fat taps have an overlapping feedback tap. The feedback tap coefficients may then be expressed as $c_1 \cdot r_1, c_1 \cdot (1-r_1) + c_2 \cdot r_2, c_2 \cdot (1-r_2)$.

The update equations for $c_1$, $c_2$, $r_1$, $r_2$ are similarly expressed as follows:

$$c_1(t) = \mu_c \cdot \int_0^t e(v) \cdot [r_1 \cdot s(v) + (1-r_1) \cdot s(v-\tau)] dv$$

$$r_1(t) = \mu_r \cdot \int_0^t c_1(v) \cdot e(v) \cdot [s(v) - s(v-\tau)] dv$$

$$c_2(t) = \mu_c \cdot \int_0^t e(v) \cdot e(v) \cdot (1-r) \cdot s(v-\tau) dv$$

$$r_2(t) = \mu_r \cdot \int_0^t c_2(v) \cdot e(v) \cdot [s(v) - s(v-\tau)] dv.$$

Quasi-LMSE-based Adaptation Schemes for Fat Tap Interpolating Mixer

Other adaptation techniques for controlling the timing control ratio parameter in the interpolating mixer within the Fat Tap may also be used. One such technique may include the use of tap coefficients on the feedforward/feedback equalizers which adapt based on LMSE, in a manner that this approximates LMSE-based adaptation for the timing control ratio parameter. Thus, if the feedforward tap coefficients within the Fat Tap are of the form $\{c_i\}_{i=0}^L$, two alternative manners of adapting the timing control ratio are provided below:

$$r = \mu \cdot \int_0^t \left( \sum_{i=0}^{L} w_i \cdot c_i \right) dt$$

or alternatively $$r = \mu \cdot \int_o^t \left( \sum_{i=0}^{L} \sum_{j=1}^{L} w_{i,j} \cdot c_i \cdot c_j \right) dt$$

for appropriately selected adaptation parameter: μ and real number weights $\{w_i\}_{i=0}^{L}$ or $\{w_{i,j}\}_{i,j=0}^{i,j=L}$.

Figure 10:
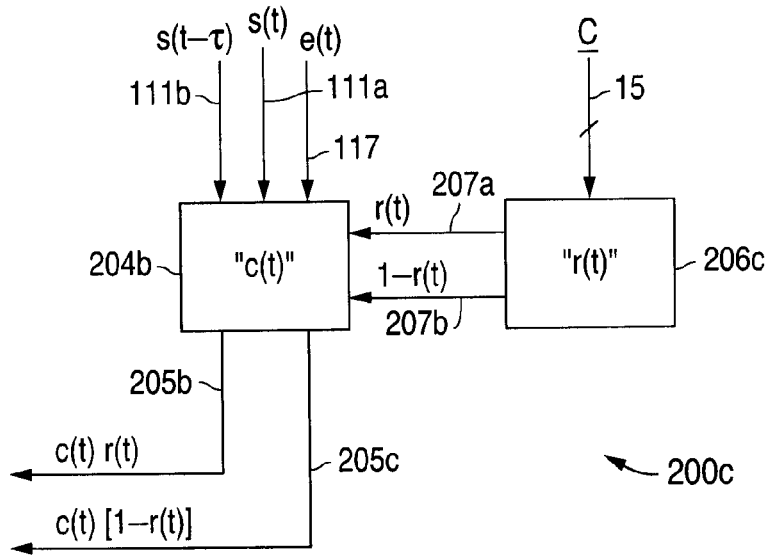
FIG. 10 is a block diagram of another embodiment of an adaptive coefficient signal generator in accordance with the presently claimed invention.

Referring to FIG. 10, another embodiment 200c of the FTA circuitry 200 (FIG. 2) uses alternative implementations 204b, 206c of the control signal generators to process the incoming time-delayed data signals 111a, 111b, the error signal 117 and adaptive filter coefficient signals 15 (discussed in more detail below) from the feedforward filter 102a of the equalizer 100 (FIG. 1).

Figure 11:
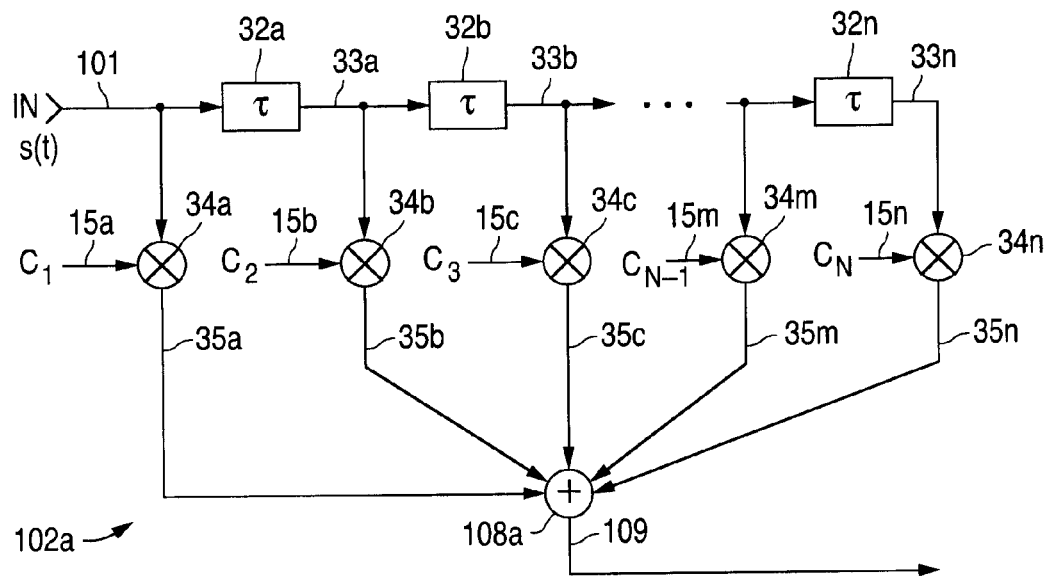
FIG. 11 is a block diagram of feedforward equalization (FFE) circuitry with which the adaptive coefficient signal generator of FIG. 10 can share adaptive filter coefficient signals.

Referring to FIG. 11, the feedforward filter 102a processes the incoming data signal 101 to produce the equalized signal 109 using a series of signal delay elements 32a, 32b, ..., 32n, multiplier circuits 34a, 34b, ..., 34n and output summing circuit 108a in accordance with well-known techniques. Each of the successively delayed versions 33a, 33b, ..., 33n of the data signal, as well as the incoming data signal 101, is multiplied in one of the multiplication circuits 34a, 34b, ..., 34n with its respective adaptive filter coefficient signal 15a, 15b, ..., 15n (along with a multiplication, or scaling, constant, as desired). The resulting product signals 35a, 35b, ..., 35n are summed in the signal summing circuit 108a, with the resulting sum signal forming the equalized signal 109.

Figure 12:
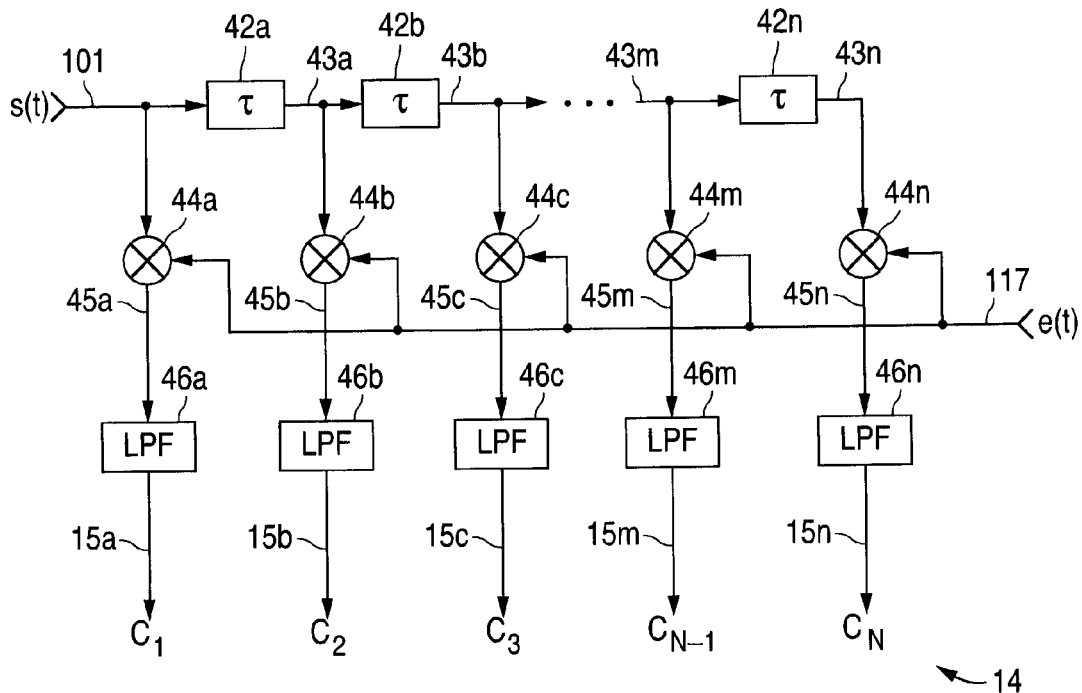
FIG. 12 is a block diagram of an exemplary implementation of an adaptive filter coefficient signal generator for providing adaptive filter coefficient signals for the adaptive coefficient signal generator of FIG. 10.

Referring to FIG. 12, an adaptive coefficients generator 14 processes the incoming data signal 101 and the error signal 117 using series of signal delay elements 42a, 42b, ..., 42n, signal multipliers 44a, 44b, ..., 44n and signal integrators (e.g., low pass filters) 46a, 46b, ..., 46n in accordance with well known techniques. The incoming signal 101 is successively delayed by the signal delay elements 42a, 42b, ..., 42n to produce successively delayed versions 43a, 43b, ..., 43n of the incoming signal 101. Each of these signals 101, 43a, 43b, ..., 43n is multiplied in its respective signal multiplier 44a, 44b, ..., 44n with the error signal 117 (along with a multiplication, or scaling, constant, as desired). The resulting product signals 45a, 45b, ..., 45n are individually integrated in the signal integration circuits 46a, 46b, ..., 46n to produce the individual adaptive filter coefficient signals 15a, 15b, ..., 15n.

Figure 13:
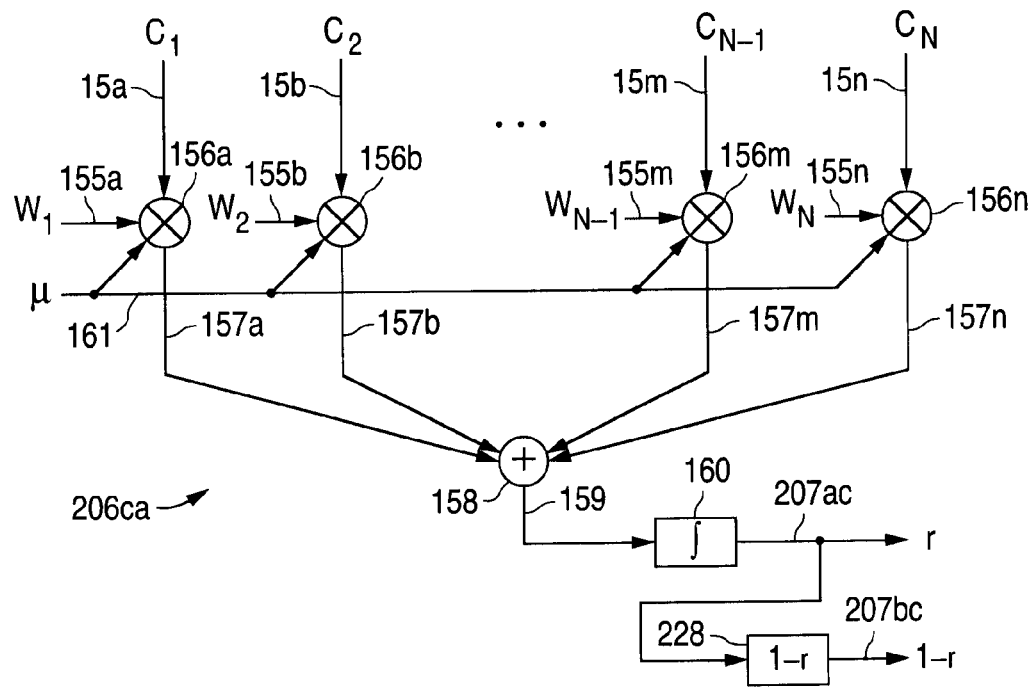
FIG. 13 is a block diagram of an exemplary implementation of a portion of the adaptive coefficient signal generator of FIG. 10.

Referring to FIG. 13, one embodiment 206ca of this alternative second control signal generator in accordance with the presently claimed invention includes a set of signal weighting circuits (e.g., multipliers) 156a, 156b, ..., 156n, a signal combining (e.g., summing) circuit 158 and a signal integration circuit (e.g., low pass filter) 160, interconnected substantially as shown. Each of the adaptive filter coefficient signals 15a, 15b, ..., 15n is weighted (e.g., multiplied) in a respective multiplier 156a, 156b . . . , 156n with a corresponding weighted, or scaled, signal 155a, 155b, ..., 155n (as well as a multiplication, or scaling, factor μ 161, as desired). The resulting product signals 157a, 157b, ... 157n are combined (e.g., summed) in the signal combiner 158. The combined signal 159 is integrated (e.g., low pass filtered) by the signal integrator 160 to produce the adaptation control signal 207ac r(t). This signal 207ac is also complemented by signal complement circuitry 228 (as discussed above) to produce the other adaptation control signal 207bc [1−r(t)] provided to the first control signal generator 204b.

Figure 14:
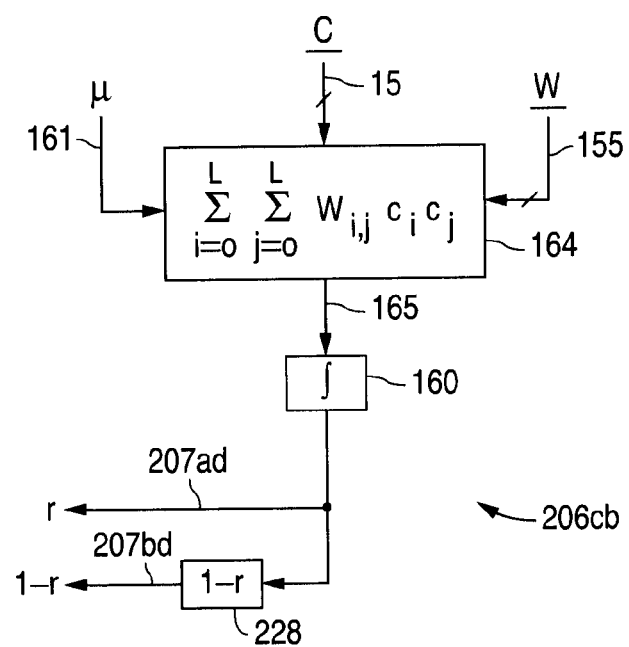
FIG. 14 is a block diagram of an alternative implementation of a portion of the adaptive coefficient signal generator of FIG. 10.

Referring to FIG. 14, another embodiment 206cb of the second control signal generator 206c in accordance with the presently claimed invention includes an alternative implementation 164 of weighting circuitry for weighting the adaptive filter coefficient signals 15 with corresponding weighted, or scaled, signals 155 (as well as a multiplication, or scaling, factor μ 161, as desired). Such weighting circuitry 164 can be implemented in accordance with well-known techniques using multiple signal weighting circuits (e.g., multipliers) and signal combining (e.g., summing) circuits to perform the prescribed weighting of the respective adaptive filter coefficient signals 15 with the corresponding weighted, or scaled, signals 155 over the appropriate ranges of i and j. As before, the resultant signal 165 is integrated (e.g., low pass filtered) by a signal integrator 160 to produce the adaptation control signal 207ad r(t). This signal 207ad is also complemented by signal complement circuitry 228 (as discussed above) to produce the other adaptation control signal 207bd [1−r(t)] provided to the first control signal generator 204b.

Alternatively, it should be understood that this technique can also be implemented using adaptive coefficient signals from an adaptive feedback filter 104 (FIG. 1).

Figure 15:
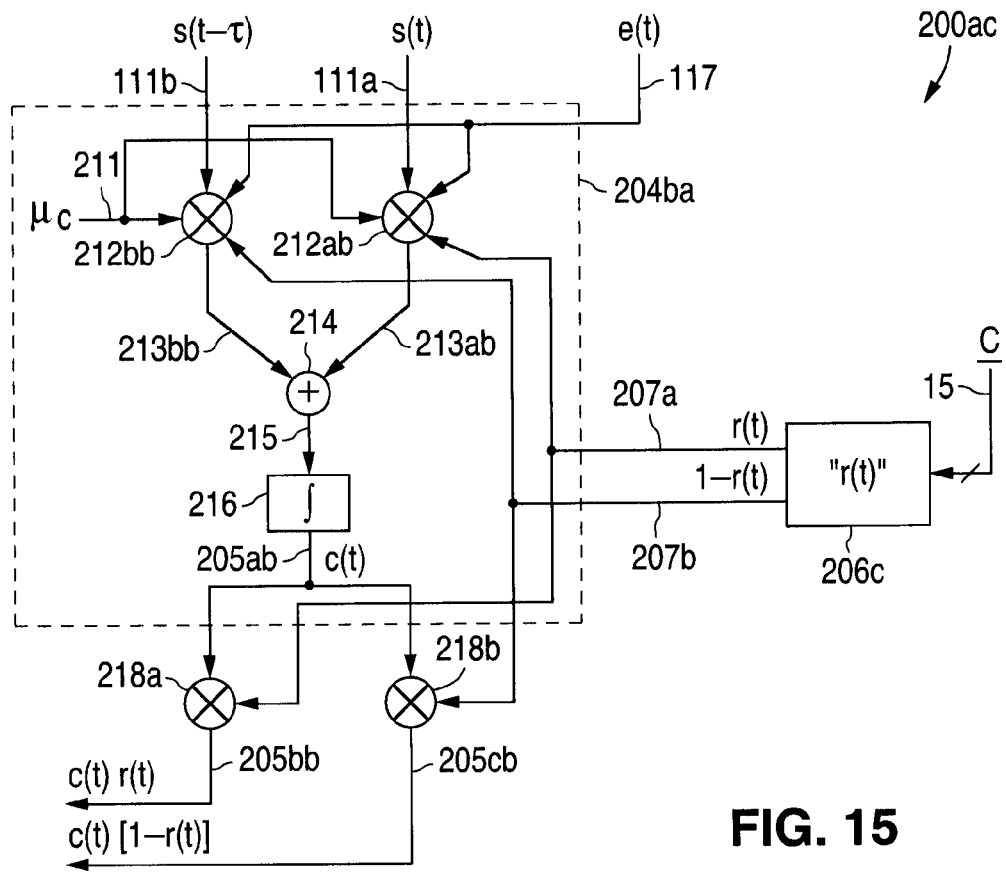
FIG. 15 is a block diagram of an exemplary implementation of the adaptive coefficient signal generator of FIG. 10.

Referring to FIG. 15, one implementation 200ac of the FTA circuit 200c of FIG. 10 can be implemented substantially as shown. Using the adaptation control signals 207a, 207b from the second control signal generator 206c (e.g., FIG. 13 or 14), the first control signal generator 204ba operates as discussed above in connection with FIG. 6.

Yet another technique for adapting the timing control ratio parameter may be using the "eye monitor" test.

Figure 16A:
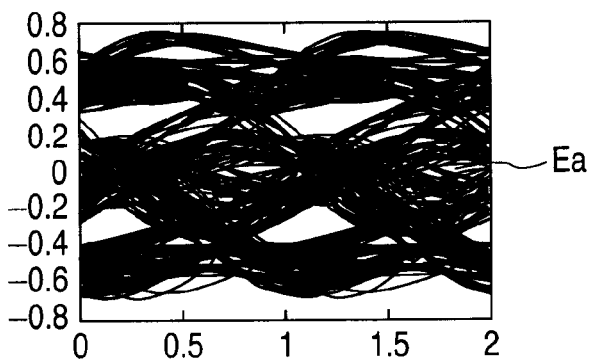
FIGS. 16A and 16B illustrate expected performance improvement with use of an analog continuous-time feedforward filter in conjunction with "fat tap" adaptation in accordance with the presently claimed invention.
Figure 16B:
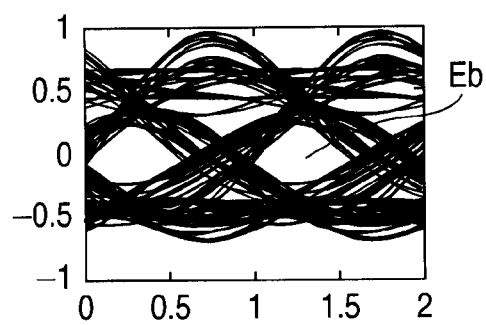

Referring to FIGS. 16A and 16B, expected performance improvement with use of an analog continuous-time feedforward filter in conjunction with "fat tap" adaptation in accordance with the presently claimed invention is as illustrated. FIG. 16A illustrates the "eye" diagram for the incoming data signal 101 (FIG. 11) prior to equalization, while FIG. 16B illustrates the "eye" diagram for the output signal 107 of the slicer 106 following equalization in accordance with the presently claimed invention. As shown, the uncompensated waveform of FIG. 16A has "eyes" Ea which are substantially closed, thereby producing a high BER corresponding to an eye-opening penalty approaching infinity. In contrast thereto, the compensated waveform of FIG. 16B has "eyes" Eb which are substantially open, thereby producing a low BER corresponding to an eye-opening penalty of approximately three decibels.

Figure 17:
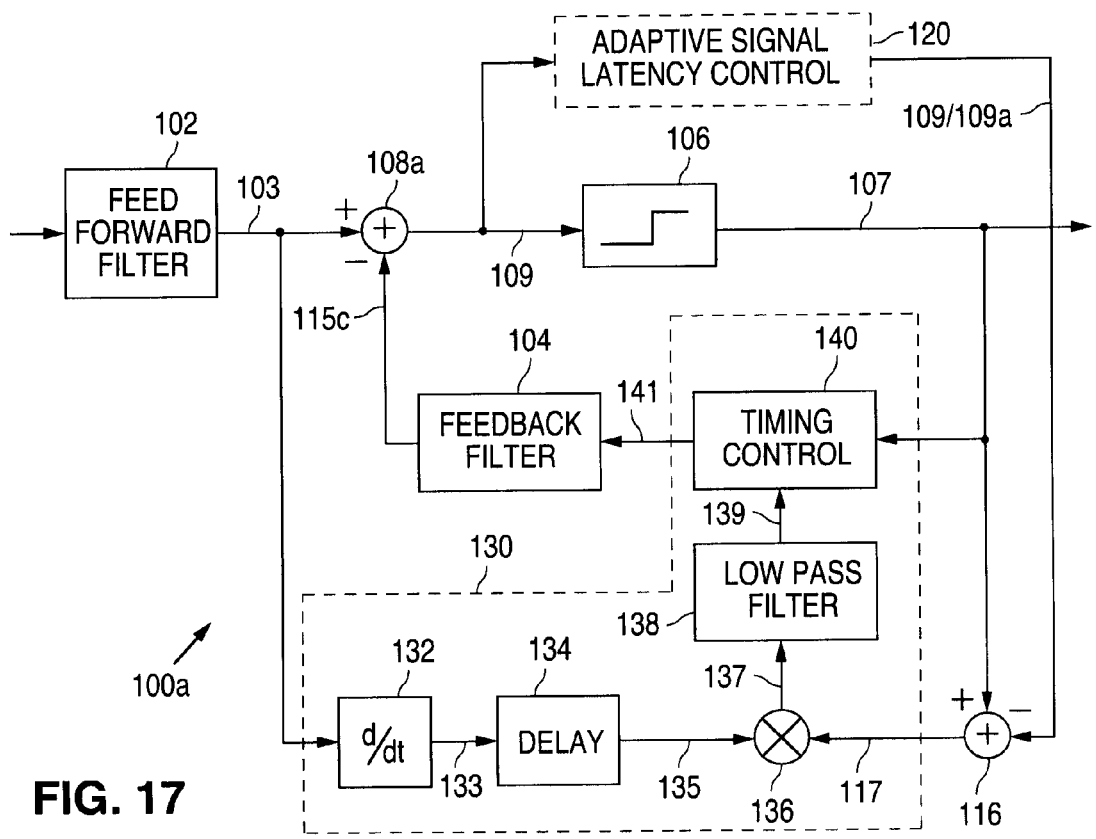
FIG. 17 is a block diagram of one example of an implementation of decision feedback equalization (DFE) circuitry providing improved data signal equalization in accordance with another embodiment of the presently claimed invention.

Referring to FIG. 17, an alternative implementation 100a of the DFE circuitry of FIG. 1 in accordance with another embodiment of the presently claimed invention includes the feed forward filter 102 and input signal combining (e.g., summing) circuit 108a, the signal slicer 106, the feedback filter 104, and the signal summing circuit 116, plus feedback timing control circuitry 130. As discussed in more detail below, this timing control circuitry 130 controls the feedback signal 115c so as to optimize the output 107 of the signal slicer 106.

In this embodiment 100a, the input signal 103 representing data is differentially summed in the signal combining circuit 108a with the feedback signal 115c to produce the pre-slicer signal 109 which is sliced by the signal slicer 106 (e.g., a voltage comparison circuit) to produce the post-slicer signal 107 representing the data of the input signal 103. This post-slicer signal 107 is differentially summed in the signal combiner 116 with the pre-slicer signal 109 to produce a difference signal 117 representing the difference between the post-slicer 107 and pre-slicer 109 signals, and is also referred to as an error signal. Alternatively, the pre-slicer signal 109 can be processed by an adaptive signal latency control circuit 120, with the resulting processed pre-slicer signal 109a being used in place of the original pre-slicer signal 109. A more detailed discussion of this optional processing circuitry 120 can be found in commonly assigned, co-pending U.S. patent application Ser. No. 10/321,893, filed Dec. 17, 2002, and entitled "Adaptive Signal Latency Control for Communications Systems Signals", the disclosure of which is incorporated herein by reference.

The input data signal 103 is also differentiated by a signal differentiation circuit 132 (e.g., high pass filter) and the resulting differentiated signal 133 is further delayed by a delay circuit 134 which can be implemented in any of a number of well known conventional ways (including as an interpolating mixer, such as that discussed in U.S. patent application Ser. No. 10/321,893). The resulting differentiated and delayed signal 135 is combined (e.g., mixed or multiplied) in another signal combiner 136 with the difference signal 117. The resulting signal 137 is filtered in a low pass filter circuit (or alternatively a signal integrator) 138 to produce a control signal 139. This control signal 139 controls a timing control circuit 140 (which can be implemented in any of a number of well known conventional ways) that provides a controllable signal delay for the post-slicer signal 107. It is this controllably delayed post-slicer signal 141 which is filtered by the feedback filter circuit 104 to produce the feedback signal 115c.

The feedback filter circuit 104 can be implemented in a conventional manner, such as that depicted in FIG. 1. For example, in FIG. 17 (using the feedback filter 104 of FIG. 1 in the circuit of FIG. 17), the incoming signal 141 is processed by a tapped delay line in filter 104 with the product signals in filter 104 (corresponding to the product signals in FIG. 1) being summed in a signal summing circuit (corresponding to circuit 114 in FIG. 1) to produce the feedback signal 115c.

The delay introduced by the delay circuit 134 is selected so as to cause its internal signal delay to equal the sum of signal delays through the input signal combiner 108a, the adaptive signal latency controller 120 (if used) and signal combiner 116 for the pre-slicer signal 109 and post-slicer signal 107 signal, less any signal delay introduced by the signal differentiation circuit 132. As a result of this delay being introduced by the delay circuit 134, the control signal 139 will have a substantially zero AC signal component.

It should be understood that the order of the signal differentiation circuit 132 and delay circuit 134 can also be reversed, such that the input signal 103 is first delayed by the delay circuit 134 and then differentiated by the signal differentiation circuit 132 to produce the differentiated and delayed signal 135.

Figure 18:
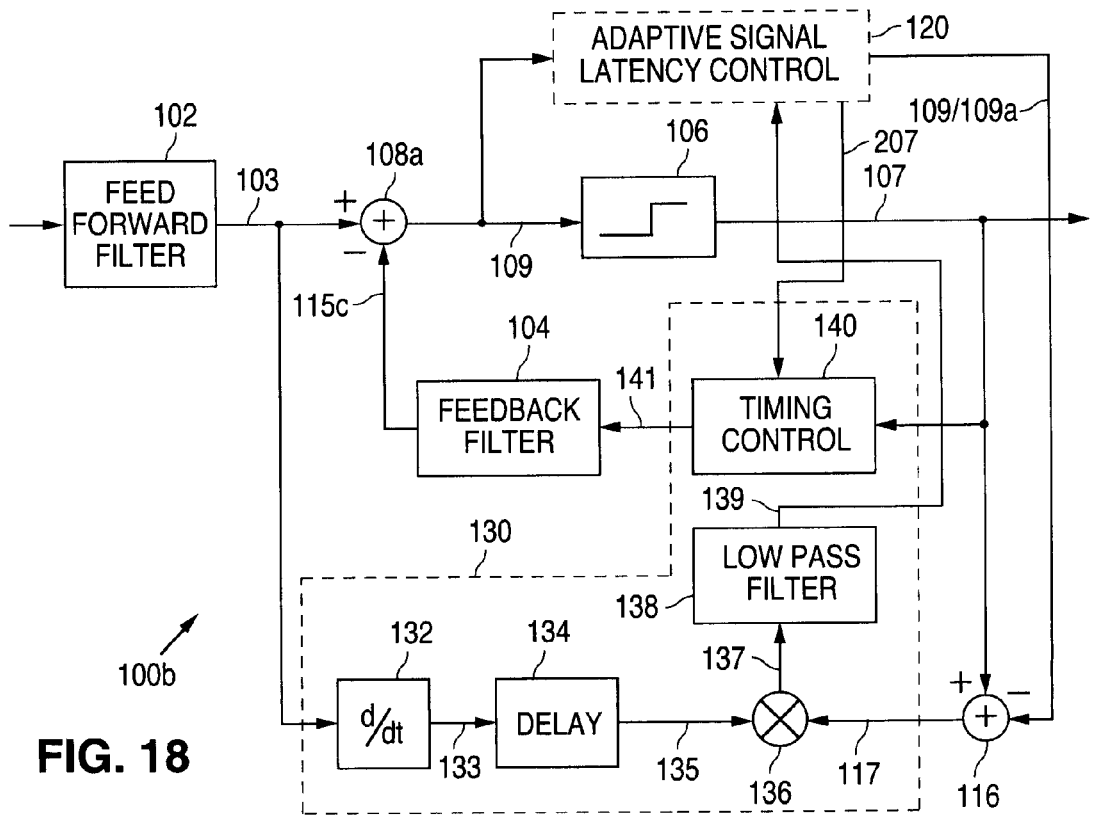
FIG. 18 is a block diagram of one example of an implementation of decision feedback equalization (DFE) circuitry providing improved data signal equalization in accordance with another embodiment of the presently claimed invention.

Referring to FIG. 18, a further alternative implementation 100b of the DFE circuitry of FIG. 1 in accordance with another embodiment of the presently claimed invention includes the adaptive signal latency control circuit 120 (discussed in more detail, as noted above, in commonly assigned, co-pending U.S. patent application Ser. No. 10/321,893, the disclosure of which is incorporated herein by reference). In this embodiment 100b, the control signal 139 produced by the low pass filter 138 serves as the interpolation control signal r(t) for the interpolating mixer within the adaptive signal latency control circuit 120 (see U.S. patent application Ser. No. 10/321,893), while the interpolation control signal 207 produced by the adaptive signal latency control circuit 120 serves as the timing control signal for the timing control circuit 140.

Figure 19:
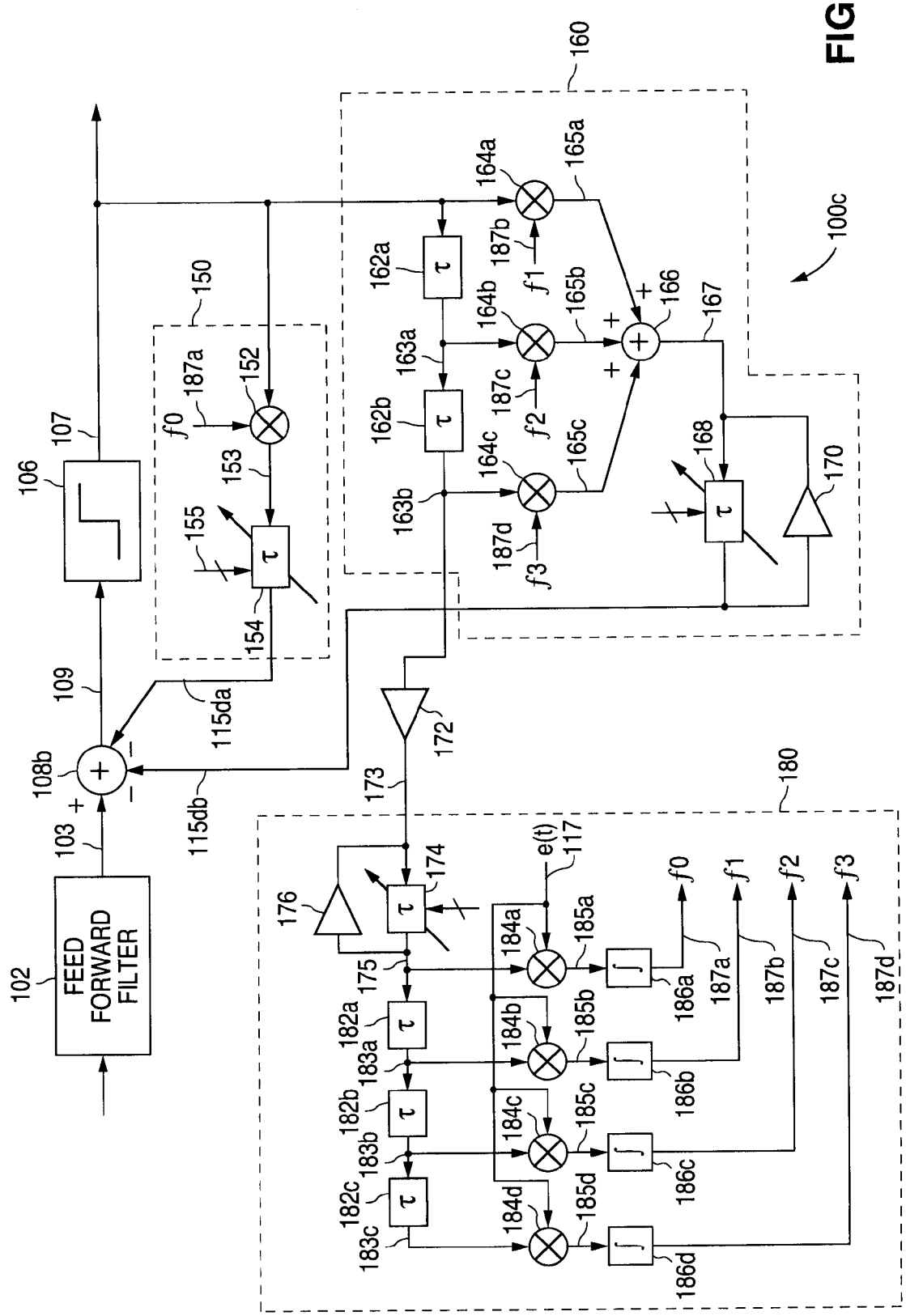
FIG. 19 is a block diagram of one example of an implementation of DFE circuitry providing improved data signal equalization in accordance with another embodiment of the presently claimed invention.

Referring to FIG. 19, a further alternative implementation 100c of the DFE circuitry of FIG. 1 in accordance with another embodiment of the presently claimed invention includes the feedforward filter 102 and input signal combining (e.g., summing) circuit 108b, the signal slicer 106, a first decision feedback equalizer circuit 150, a second decision feedback equalizer 160, and an adaptation control circuit 180, all interconnected substantially as shown. As discussed in more detail below, the decision feedback equalization circuits 150, 160 process the post□slicer signal 107 using multiplication coefficients f0, f1, f2, f3 in the form of adaptive timing control signals 187a, 187b, 187c, 187d to produce two feedback signals 115da, 115db which are subtracted from the incoming data signal 103 in the signal summing circuit 108b.

The first decision feedback equalization circuit 150 includes signal combining circuitry in the form of a multiplication circuit 152, followed by an adaptive signal delay circuit 154. The post-slicer signal 107 is multiplied with the adaptation control signal 187a. The product signal 153 is then selectively delayed by the adaptive signal delay circuit 154 to produce the feedback signal 115da. The adaptive signal delay circuit 154 is controlled in accordance with a number of control signals 155 that control things such as amplifier gain factors and signal interpolation ratios. A more detailed description of this type of circuit can be found in U.S. patent application Ser. No. 10/724,561, filed Nov. 26, 2003, and entitled, "Analog Signal Interpolation", the disclosure of which is incorporated herein by reference.

The second decision feedback equalization circuit 160 includes a tapped delay line formed by successively connected delay elements 162a, 162b, a signal combining circuit in the form of multiplication circuits 164a, 164b, 164c, a signal summing circuit 166, and an adaptive signal delay circuit 168, all interconnected substantially as shown. The post□slicer signal 107 is multiplied in multiplication circuit 164a with coefficient f1 in the form of adaptation control signal 187b. The post□slicer signal 107 is also successively delayed using signal delay elements 162a, 162b. The resulting delayed signals 163a, 163b are multiplied in their respective multiplication circuits 164b, 164c with coefficients f2, f3 in the form of adaptation control signals 187c, 187d. The resulting product signals 165a, 165b, 165c are added in a signal summing circuit 166. The resultant signal 167 is delayed with the adaptive signal delay circuit 168 to produce the feedback signal 115db. This adaptive delay circuit 168 is similar to the adaptive delay circuit 154 in the first decision feedback equalization circuit 150. Additionally, an offset correction circuit 170 uses the feedback signal 115db correct for any input signal 167 offsets.

The adaptation control circuitry 180 includes a tapped delay line in the form of signal delay elements 182a, 182b, 182c, signal combining circuitry in the form of multiplication circuits 184a, 184b, 184c, 184d, and signal integration circuits (e.g., lowpass filters) 186a, 186b, 186c, 186d, all interconnected substantially as shown. The last delayed post□slicer signal 163b is buffered by a buffer amplifier 172 prior to being adaptively delayed by another adaptive signal delay circuit 174 (similar to those adaptive signal delay circuits 154, 168 discussed above) to produce the input signal 175 for the tapped delay line. Additionally, an offset correction circuit 176 uses this signal 175 to correct for any offsets in the input signal 173.

This signal 175 is successively delayed by the individual signal delay elements 182a, 182b, 182c. This signal 175, and the successively delayed signals 183a, 183b, 183c are multiplied by their respective multiplication circuits 184a, 184b, 184c, 184d with the error signal 117. The resulting product signals 185a, 185b, 185c, 185d are integrated (e.g., lowpass filtered) by the signal integration circuits 186a, 186b, 186c, 186d to produce the adaptation control signals 187a, 187b, 18c, 187d.

Various types of signal delay elements similar to those 162a, 162b, 183a, 183b, 183c discussed above are well known in the art. In accordance with a preferred embodiment of the presently claimed invention, these delay elements have a nominal delay of approximately 50 picoseconds, and a more detailed discussion can be found in U.S. patent application Ser. No. 10/724,443, filed Nov. 26, 2003, and entitled "Analog Delay Elements", the disclosure of which is incorporated herein by reference.

Based upon the foregoing discussion, it should be recognized that each of the exemplary embodiments of the presently claimed invention as depicted and discussed herein offer similar advantages without any one of such embodiments necessarily being preferred over the others. As will be readily appreciated by one of ordinary skill in the art, the particular topology of each embodiment may cause one particular embodiment to be deemed more advantageous for the specific host system or network in which such embodiment is to be implemented (e.g., due to circuit design rules or layout constraints).

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a decision feedback equalizer with dynamic feedback control for adaptively controlling a pre-slicer data signal that is sliced to provide a post-slicer data signal, comprising:

first signal combining circuitry that combines a feedback signal and an input signal representing a plurality of data to provide a pre-slicer signal;

controllable delay circuitry, coupled to said first signal combining circuitry, that delays said pre-slicer signal in response to a delay control signal to produce a corresponding delayed pre-slicer signal;

signal slicing circuitry, coupled to said first signal combining circuitry, that slices said pre-slicer signal to produce a post-slicer signal indicative of said plurality of data;

decision feedback circuitry including input signal timing control, coupled to said controllable delay circuitry and said signal slicing circuitry, that feeds back said post-slicer signal in response to a timing control signal to produce said feedback signal;

second signal combining circuitry, coupled to said controllable delay circuitry and said signal slicing circuitry, that combines said delayed pre-slicer signal and said post-slicer signal to produce a difference signal indicative of a difference between said delayed pre-slicer signal and post-slicer signal;

signal differentiation circuitry with a selected signal delay that differentiates and delays said input signal to produce a resultant signal, wherein respective portions of said resultant signal are delayed relative to corresponding portions of said input signal by said selected signal delay; and third signal combining circuitry, coupled to said second signal combining circuitry and said signal differentiation circuitry, that combines said difference signal and said resultant signal to produce said delay control signal, wherein said selected signal delay is selected and said delayed pre-slicer signal is delayed relative to said pre-slicer signal such that said timing control signal has a substantially zero alternating current (AC) signal component.

2. The apparatus of claim 1, wherein said first signal combining circuitry comprises a signal summing circuit.

3. The apparatus of claim 1, wherein said signal slicing circuitry comprises a voltage comparison circuit.

4. The apparatus of claim 1, wherein said decision feedback circuitry comprises:

signal timing control circuitry, coupled to said controllable delay circuitry and said signal slicing circuitry, that selectively delays said post-slicer signal in response to said timing control signal to produce a delayed post-slicer signal; and feedback filter circuitry, coupled to said signal timing control circuitry, that filters said delayed post-slicer signal to produce said feedback signal.

5. The apparatus of claim 1, wherein said decision feedback circuitry comprises:

signal timing control circuitry, coupled to said controllable delay circuitry and said signal slicing circuitry, that selectively delays said post-slicer signal in response to said timing control signal to produce a delayed post-slicer signal;

tapped delay circuitry, coupled to said signal timing control circuitry, that successively delays said delayed post-slicer signal to produce a plurality of further delayed post-slicer signals;

mixer circuitry, coupled to said tapped delay circuitry, that mixes each one of said plurality of further delayed post-slicer signals with a respective one of a plurality of coefficient signals to produce a plurality of mixed signals; and fourth signal combining circuitry, coupled to said mixer circuitry, that combines said plurality of mixed signals to produce said feedback signal.

6. The apparatus of claim 1, wherein said second signal combining circuitry comprises a signal summing circuit.

7. The apparatus of claim 1, wherein said signal differentiation circuitry comprises high pass filter circuitry that high pass filters and delays said input signal to produce said resultant signal.

8. The apparatus of claim 1, wherein said signal differentiation circuitry comprises:

a high pass filter circuit that high pass filters said input signal to produce a high pass filtered signal; and signal delay circuitry, coupled to said high pass filter circuit, delays said high pass filtered signal to produce said resultant signal.

9. The apparatus of claim 1, wherein said third signal combining circuitry comprises:

a signal multiplication circuit that multiplies said difference signal and said resultant signal to produce a product signal; and low pass filter circuitry, coupled to said signal multiplication circuit, that low pass filters said product signal to produce said delay control signal.

10. The apparatus of claim 1, wherein said third signal combining circuitry comprises:
- a signal multiplication circuit that multiplies said difference signal and said resultant signal to produce a product signal; and
- signal integration circuitry, coupled to said signal multiplication circuit, that integrates said product signal to produce said delay control signal.

11. An apparatus including a decision feedback equalizer with dynamic feedback control for adaptively controlling a pre-slicer data signal that is sliced to provide a post-slicer data signal, comprising:
- first signal combiner means for combining a feedback signal and an input signal representing a plurality of data and generating a pre-slicer signal;
- controllable delay means for delaying said pre-slicer signal in response to a delay control signal and generating a corresponding delayed pre-slicer signal;
- signal slicer means for slicing said pre-slicer signal and generating a post-slicer signal indicative of said plurality of data;
- decision feedback means for controlling signal timing by feeding back said post-slicer signal in response to a timing control signal and generating said feedback signal;
- second signal combiner means for combining said delayed pre-slicer signal and said post-slicer signal and generating a difference signal indicative of a difference between said delayed pre-slicer signal and said post-slicer signal;
- signal differentiator means with a selected signal delay for differentiating and delaying said input signal and generating a resultant signal, wherein respective portions of said resultant signal are delayed relative to corresponding portions of said input signal by said selected signal delay; and
- third signal combiner means for combining said difference signal and said resultant signal and generating said delay control signal, wherein said selected signal delay is selected and said delayed pre-slicer signal is delayed relative to said pre-slicer signal such that said timing control signal has a substantially zero alternating current (AC) signal component.

12. A method for providing decision feedback equalization with dynamic feedback control for adaptively controlling a pre-slicer data signal that is sliced to provide a post-slicer data signal, comprising:
- combining a feedback signal and an input signal representing a plurality of data and generating a pre-slicer signal;
- delaying said pre-slicer signal in response to a delay control signal and generating a corresponding delayed pre-slicer signal;
- slicing said pre-slicer signal and generating a post-slicer signal indicative of said plurality of data;
- feeding back said post-slicer signal with controlled signal timing in response to a timing control signal and generating said feedback signal;
- combining said delayed pre-slicer signal and said post-slicer signal and generating a difference signal indicative of a difference between said delayed pre-slicer signal and said post-slicer signal;
- differentiating and delaying said input signal and generating a resultant signal, wherein respective portions of said resultant signal are delayed relative to corresponding portions of said input signal by a selected signal delay; and
- combining said difference signal and said resultant signal and generating said delay control signal, wherein said selected signal delay is selected and said delayed pre-slicer signal is delayed relative to said pre-slicer signal such that said timing control signal has a substantially zero alternating current (AC) signal component.

13. The method of claim 12, wherein said feeding back said post-slicer signal with controlled signal timing in response to a timing control signal and generating said feedback signal comprises:
- selectively delaying said post-slicer signal in response to said timing control signal and generating a delayed post-slicer signal; and
- filtering said delayed post-slicer signal and generating said feedback signal.

14. The method of claim 12, wherein said feeding back said post-slicer signal with controlled signal timing in response to a timing control signal and generating said feedback signal comprises:
- selectively delaying said post-slicer signal in response to said timing control signal and generating a delayed post-slicer signal;
- successively delaying said delayed post-slicer signal and generating a plurality of further delayed post-slicer signals;
- mixing each one of said plurality of further delayed post-slicer signals with a respective one of a plurality of coefficient signals and generating a plurality of mixed signals; and
- combining said plurality of mixed signals and generating said feedback signal.

15. The method of claim 12, wherein said differentiating and delaying said input signal and generating a resultant signal comprises:
- high pass filtering said input signal and generating a high pass filtered signal; and
- delaying said high pass filtered signal and generating said resultant signal.

16. The method of claim 12, wherein said combining said difference signal and said resultant signal and generating said timing control signal comprises:
- multiplying said difference signal and said resultant signal and generating a product signal; and
- low pass filtering said product signal and generating said timing control signal.

17. The method of claim 12, wherein said combining said difference signal and said resultant signal and generating said timing control signal comprises:
- multiplying said difference signal and said resultant signal and generating a product signal; and
- integrating said product signal and generating said timing control signal.

* * * * *

UNITED STATES PATENT AND TRADEMARK OFFICE
CERTIFICATE OF CORRECTION

PATENT NO. : 7,394,849 B2
APPLICATION NO. : 11/539810
DATED : July 1, 2008
INVENTOR(S) : Ibragimov et al.

It is certified that error appears in the above-identified patent and that said Letters Patent is hereby corrected as shown below:

At patent column 12, line 51, please delete "FAT" and insert --Fat--.

At patent column 13, line 19, please delete "$f(t) = f_i(t) + c \cdot (1 - r_2) \cdot s(t \cdot 2 \cdot \tau),$" and insert --$f(t) = f_i(t) + c \cdot (1 - r_2) \cdot s(t - 2 \cdot \tau),$--.

At patent column 13, line 54, please delete "$f_1(\cdot(\cdot),$" and insert --$f_1(\cdot), f_2(\cdot),$--.

At patent column 14, line 50, please delete "$c_2(t) = \mu_c \cdot \int_0^t e(v) \cdot (1 - r_2) \cdot s(v - \tau) dv$" and insert --$c_2(t) = \mu_c \cdot \int_0^t e(v) \cdot [r_2 \cdot s(v) + (1 - r_2) \cdot s(v - \tau)] dv$--.

At patent column 14, line 65, please delete "$\{c_i\}_{i=0}^L,$" and insert -- $\{c_i\}_{i=0}^L$ --.

At patent column 15, line 8, please delete " $r = \mu \cdot \int_0^t \left( \sum_{i=0}^L \sum_{j=1}^L w_{i \cdot j} \cdot c_i \cdot c_j \right) dt$ " and insert -- $r = \mu \cdot \int_0^t \left( \sum_{i=0}^L \sum_{j=0}^L w_{i \cdot j} \cdot c_i \cdot c_j \right) dt$ --.

At patent column 18, line 13, please delete "post☐slicer" and insert --post-slicer--.

At patent column 18, line 38, please delete "post☐slicer" and insert --post-slicer--.

At patent column 18, line 40, please delete "post☐slicer" and insert --post-slicer--.

At patent column 18, line 59, please delete "post☐slicer" and insert --post-slicer--.

UNITED STATES PATENT AND TRADEMARK OFFICE
CERTIFICATE OF CORRECTION

PATENT NO. : 7,394,849 B2
APPLICATION NO. : 11/539810
DATED : July 1, 2008
INVENTOR(S) : Ibragimov et al.

It is certified that error appears in the above-identified patent and that said Letters Patent is hereby corrected as shown below:

At patent column 19, line 28, please delete "alternations" and insert --alterations--.

Signed and Sealed this

Twenty-sixth Day of August, 2008

JON W. DUDAS
*Director of the United States Patent and Trademark Office*